United States Patent
Murakami

(10) Patent No.: US 7,300,817 B2
(45) Date of Patent: Nov. 27, 2007

(54) METHOD OF MANUFACTURING A SEMICONDUCTOR IMAGING DEVICE HAVING A REFRACTIVE INDEX MATCHING LAYER

(75) Inventor: Ichiro Murakami, Kanagawa (JP)

(73) Assignee: Sony Corporation, Tokyo (JP)

(*) Notice: Subject to any disclaimer, the term of this patent is extended or adjusted under 35 U.S.C. 154(b) by 115 days.

(21) Appl. No.: 10/974,575

(22) Filed: Oct. 27, 2004

(65) Prior Publication Data

US 2005/0082629 A1    Apr. 21, 2005

Related U.S. Application Data

(62) Division of application No. 10/356,065, filed on Jan. 31, 2003, now Pat. No. 6,833,601.

(30) Foreign Application Priority Data

Feb. 5, 2002 (JP) ............................. 2002-028585

(51) Int. Cl.
*H01L 21/473* (2006.01)
(52) U.S. Cl. ...................... 438/69; 438/73; 438/786
(58) Field of Classification Search .................. 438/69
See application file for complete search history.

(56) References Cited

U.S. PATENT DOCUMENTS

| | | | |
|---|---|---|---|
| 5,523,609 A | 6/1996 | Fukusho | |
| 6,218,719 B1 | 4/2001 | Tsang | |
| 6,348,361 B1 | 2/2002 | Lee et al. | |
| 6,380,480 B1 | 4/2002 | Norimatsu et al. | |
| 6,429,538 B1 | 8/2002 | Lin | |
| 6,507,081 B2 | 1/2003 | Smith et al. | |
| 2002/0052127 A1* | 5/2002 | Gau et al. ................. | 438/786 |

FOREIGN PATENT DOCUMENTS

JP        07321368 A   * 12/1995

* cited by examiner

*Primary Examiner*—Stephen W. Smoot
(74) *Attorney, Agent, or Firm*—Robert J. Depke; Rockey, Depke & Lyons, LLC.

(57) ABSTRACT

A semiconductor device includes a plurality of photoelectric conversion photodiodes provided on a silicon substrate, and a refractive index matching film provided on each of the photodiodes. The refractive index matching film is composed of an insulating compound layer represented by $SiO_xN_y$ ($0 \leq x$ and $y$) assuming that the molar ratio of silicon, oxygen and nitrogen of the compound layer is $1:x:y$. The oxygen content of the compound layer is the lowest at the silicon interface with each photodiode and the highest in an upper portion of the compound layer, and the nitrogen content is the highest at the silicon interface with each photodiode and the lowest in the upper portion of the compound layer. Therefore, multiple reflection can be decreased to improve light receiving sensitivity, as compared with a case in which a SiN single layer and a $SiO_2$ single layer are laminated.

8 Claims, 15 Drawing Sheets

PRIOR ART

METHOD OF MANUFACTURING A SEMICONDUCTOR IMAGING DEVICE HAVING A REFRACTIVE INDEX MATCHING LAYER

The subject matter of U.S. Pat. No. 6,833,601 is incorporated herein by reference. The present application is a divisional of Ser. No. 10/356,065, now U.S. Pat. No. 6,833,601 filed Jan. 31, 2003, which claims priority to Japanese patent application number JP 2002-028585, filed Feb. 5, 2002. The present application claims priority to these previously filed applications.

BACKGROUND OF THE INVENTION

1. Field of the Invention

The present invention relates a semiconductor device suitably used for a photoelectric transducer such as a photocoupler or the like, a solid-state imaging device or field-effect imaging device comprising a semiconductor image sensor which receives light incident on an on-chip lens formed on a color filter, a method of manufacturing the semiconductor device, and an apparatus for manufacturing a semiconductor.

More specifically, a refractive index matching film is provided on a photoelectric conversion light-receiving element, and a composition composed of silicon, oxygen and nitrogen which constitute the refractive index matching film is adjusted so that the refractive index of a compound layer constituting the refractive index matching film continuously changes from the refractive index of a silicon oxide film of 1.45 to the refractive index of a silicon nitride film of 2.0. As a result, reflection from the light receiving element can be minimized, and light receiving sensitivity can be improved.

2. Description of the Related Art

In recent years, a video camera and a digital still camera have been increasingly used in many schools, homes and broadcast stations. Such a camera requires a solid-state imaging device. The solid-state imaging device comprises CCD (Charge Coupled Device) imaging devices arranged as photoelectric transducers in a two-dimensional form. The CCD imaging device means a semiconductor device having a structure in which unit elements each comprising a photodiode and a MOS capacitor are regularly arranged. The solid-state imaging device has the function to move a group of charges stored in the surface of a semiconductor substrate along the array direction of electrodes of the MOS capacitors.

Namely, the solid-state imaging device comprises pluralities of photodiodes, MOS capacitors, vertical transfer registers, horizontal transfer registers, and charge detecting amplifiers, which are provided on the semiconductor substrate. When light is applied to a light receiving surface of the solid-state imaging device, the light is converted into signal charges by the photodiodes, and then stored in the MOS capacitors. The signal charges stored in the MOS capacitors are transferred by the vertical transfer registers (referred to as "vertical CCD sections" hereinafter) and horizontal transfer registers, and finally detected by the charge detecting amplifiers and read as analogue received signals.

FIG. 14 is a sectional view showing an example of a configuration of a solid-state imaging device 10 of a first conventional example. As shown in FIG. 14, a semiconductor buried layer (P-WELL) 1 is formed on a N-type silicon substrate 11, the P-WELL 1 comprising photodiodes PD each having a N-type impurity region (impurity diffused layer) 2, and vertical CCD sections 12 each having a N-type impurity region (impurity diffused layer) 3. The P-WELL 1 further comprises transfer gate sections 13 for reading out signal charges from the photodiodes PD to the vertical CCD sections 12, to isolate the silicon substrate 11.

The N-type impurity region 2 constituting each of the photodiodes PD is isolated from the N-type impurity region 3 constituting the corresponding vertical CCD section 12 by a channel stopper 4 comprising a P-type impurity region. Furthermore, a transfer electrode 17 is provided on each of the vertical CCD sections 12 through a gate insulating film (silicon oxide film) 14.

The transfer electrodes 17 of the vertical CCD sections 12 are covered with a shielding film 19 composed of aluminum or tungsten through an interlayer insulating film 18. The shielding film 19 has apertures formed above the photodiodes PD to define light-receiving windows 21. The shielding film 19 is coated with a cover film 22 comprising a silicon oxide film of PSG or the like. Furthermore, a planarizing film 23, a color filter 24, and microlenses 25 are formed in order on the cover film 22.

The material of the cover film 22 is not limited to the silicon oxide film, and an example using a silicon nitride film is also known. For example, the technical document, Japanese Unexamined Patent Application Publication No. 60-177778, discloses that a plasma silicon nitride film is formed on a transparent electrode composed of polycrystalline silicon. However, in such a structure in which a silicon nitride film is deposited, an increase in short-wavelength sensitivity is expected due to a multiple interference effect.

Therefore, in the structure shown in FIG. 14 in which the silicon interfaces of the photodiodes PD are covered directly with the cover film 22, a loss of incident light is increased due to surface reflection from the N-type silicon substrate 11 to fail to obtain sufficient light receiving sensitivity.

In addition, in the structure in which the plasma silicon nitride film is formed below the planarizing film 23, ripple occurs in spectral transmittance due to an interference effect between a silicon nitride film serving as the interlayer insulating film 18 and a silicon nitride film serving as the gate insulating film 14 provided below the interlayer insulating film 18. Therefore, the spectral characteristics of the color filter layer 24 easily vary.

In order to solve the above-described problem, for example, Patent Publication No. 3196727 discloses a technique for forming an anti-reflection film on photodiodes PD. FIG. 15 is a sectional view showing an example of a construction of a solid-state imaging device 10' of a second conventional example.

The solid-state imaging device 10' shown in FIG. 15 comprises a N-type silicon substrate 11 on a surface of which photodiodes PD are formed for obtaining signal charges. Each of the photodiodes PD comprises a N-type impurity region (impurity diffused region) 2.

Furthermore, a silicon oxide thin film serving as a gate insulating film 14 is formed on the silicon substrate 11, and a silicon nitride film serving as an anti-reflection thin film 15 having a refractive index higher than that of the silicon oxide film 14 and lower than that of the silicon substrate 11 is formed on the silicon oxide thin film 14. The refractive index of the silicon oxide film 14 is about 1.45, and the refractive index of the silicon nitride film is about 2.0. Assuming that the refractive index is n, the thickness t of each of the silicon oxide film and the silicon nitride film is set to satisfy the relationship $350/(4n)$ nm $\leq t \leq 450/(4n)$ nm. These films 14 and 15 are formed for preventing a dark current.

When the thickness of each of the silicon oxide film and the silicon nitride film is set as described above, the anti-reflection film 15 having relatively flat reflection in the visible light region can be obtained. By appropriately setting the thickness of each of the silicon oxide film and the silicon nitride film, reflectance can be suppressed to an average of about 12 to 13%, and is thus suppressed to about ⅓ of the reflectance of the conventional silicon substrate 11 of about 40%.

Like in the first conventional example, transfer electrodes 17 are formed on the vertical CCD sections 12 through a silicon oxide film. Furthermore, a shielding film 19 composed of aluminum or tungsten is deposited through an interlayer insulating film 18, the shielding film 19 having apertures respectively formed above the photodiodes PD.

A cover film 22 is formed on the shielding film 19. The cover film 22 comprises a PSG film serving as a silicon-based passivation film, and has a refractive index of about 1.46. In addition, a planarizing layer 23, a filter layer 24, and microlenses 25 are formed on the cover film 22. The refractive index of the color filter layer 24 is about 1.5 to 1.6, and is thus substantially the same as the passivation film.

However, the solid-state imaging device (simply referred to as the "semiconductor device" hereinafter) 10' of the second conventional example shown in FIG. 15 has the following problems:

(1) The refractive index of the cover film 22 formed above the anti-reflection film (silicon nitride film) 15 is about 1.4 to 1.6, and is greatly different from the refractive index 2.0 of the silicon nitride film serving as the anti-reflection film 15. Therefore, reflection occurs between the anti-reflection film 15 and the cover film 22.

(2) The reflection between the anti-reflection film 15 and the cover film 22 is associated with reflection from the photodiodes (light receiving elements) PD, thereby causing a smear and inhibiting an improvement in light receiving sensitivity.

SUMMARY OF THE INVENTION

The present invention has been achieved for solving the above problems, and an object of the present invention is to provide a semiconductor device having a structure in which refractive index matching between upper and lower films is controlled so as to minimize reflection from a light receiving element and to improve light receiving sensitivity, a method of manufacturing the semiconductor device, and an apparatus for manufacturing a semiconductor.

In an aspect of the present invention, a semiconductor device comprises a substrate, and a compound layer provided on the substrate, wherein the compound layer is represented by $SiO_xN_y$ ($0 \leq x$ and $y$) assuming that the molar ratio of silicon, oxygen and nitrogen of the compound layer is 1:x:y, the oxygen content is the lowest near the interface with the substrate and the highest in an upper portion of the compound layer, and the nitrogen content is the highest near the interface with the substrate and the lowest in the upper portion of the compound layer.

In another aspect of the present invention, a semiconductor device comprises a semiconductor substrate, and an insulating compound layer provided on the semiconductor substrate, wherein the insulating compound layer is represented by $SiO_xN_y$ ($0 \leq x$ and $y$) assuming that the molar ratio of silicon, oxygen and nitrogen of the insulating compound layer is 1:x:y, the oxygen content is the lowest at the interface with the semiconductor substrate and the highest in au upper portion of the insulating compound layer, and the nitrogen content is the highest at the interface with the semiconductor substrate and the lowest in the upper portion of the insulating compound layer.

In a further aspect of the present invention, a semiconductor device for photoelectrically converting received light to output a received light signal comprises a semiconductor substrate, a plurality of photoelectric conversion light receiving elements provided on the semiconductor substrate, and a refractive index matching film provided on the light receiving elements, wherein the refractive index matching film comprises an insulating compound layer represented by $SiO_xN_y$ ($0 \leq x$ and $y$) assuming that the molar ratio of silicon, oxygen and nitrogen of the compound layer is 1:x:y, the oxygen content of the compound layer is the lowest at the interface with each light receiving element and the highest in au upper portion of the compound layer, and the nitrogen content of the compound layer is the highest at the interface with each light receiving element and the lowest in the upper portion of the compound layer.

In a still further aspect of the present invention, a method of manufacturing a semiconductor device for photoelectrically converting received light to output a received light signal comprises a step of forming a plurality of photoelectric conversion light receiving elements on a semiconductor substrate, and a step of forming a refractive index matching film on each of the light receiving elements formed on the semiconductor substrate, wherein the refractive index matching film comprises an insulating compound layer represented by $SiO_xN_y$ ($0 \leq x$ and $y$) assuming that the molar ratio of silicon, oxygen and nitrogen of the insulating compound layer is 1:x:y, the oxygen content of the compound layer is the lowest at the interface with each light receiving element and the highest in au upper portion of the compound layer, and the nitrogen content of the compound layer is the highest at the interface with each light receiving element and the lowest in the upper portion of the compound layer.

In a further aspect of the present invention, an apparatus for manufacturing a semiconductor device for photoelectrically converting received light to output a received light signal comprises a formation means for forming a plurality of photoelectric conversion light receiving elements on a semiconductor substrate, and a deposition means for depositing a refractive index matching film on each of the light receiving elements formed on the semiconductor substrate, wherein in depositing the refractive index matching film by the deposition means, an insulating compound layer represented by $SiO_xN_y$ ($0 \leq x$ and $y$) assuming that the molar ratio of silicon, oxygen and nitrogen of the insulating compound layer is 1:x:y is deposited so that the oxygen content of the compound layer is the lowest at the interface with each light receiving element and the highest in an upper portion of the compound layer, and the nitrogen content of the compound layer is the highest at the interface with each light receiving element and the lowest in the upper portion of the compound layer.

DESCRIPTION OF THE PREFERRED EMBODIMENTS

A semiconductor device, a manufacturing method therefor, and a semiconductor manufacturing apparatus according to embodiments of the present invention will be described below with reference to the drawings.

First Embodiment

Figure 1:
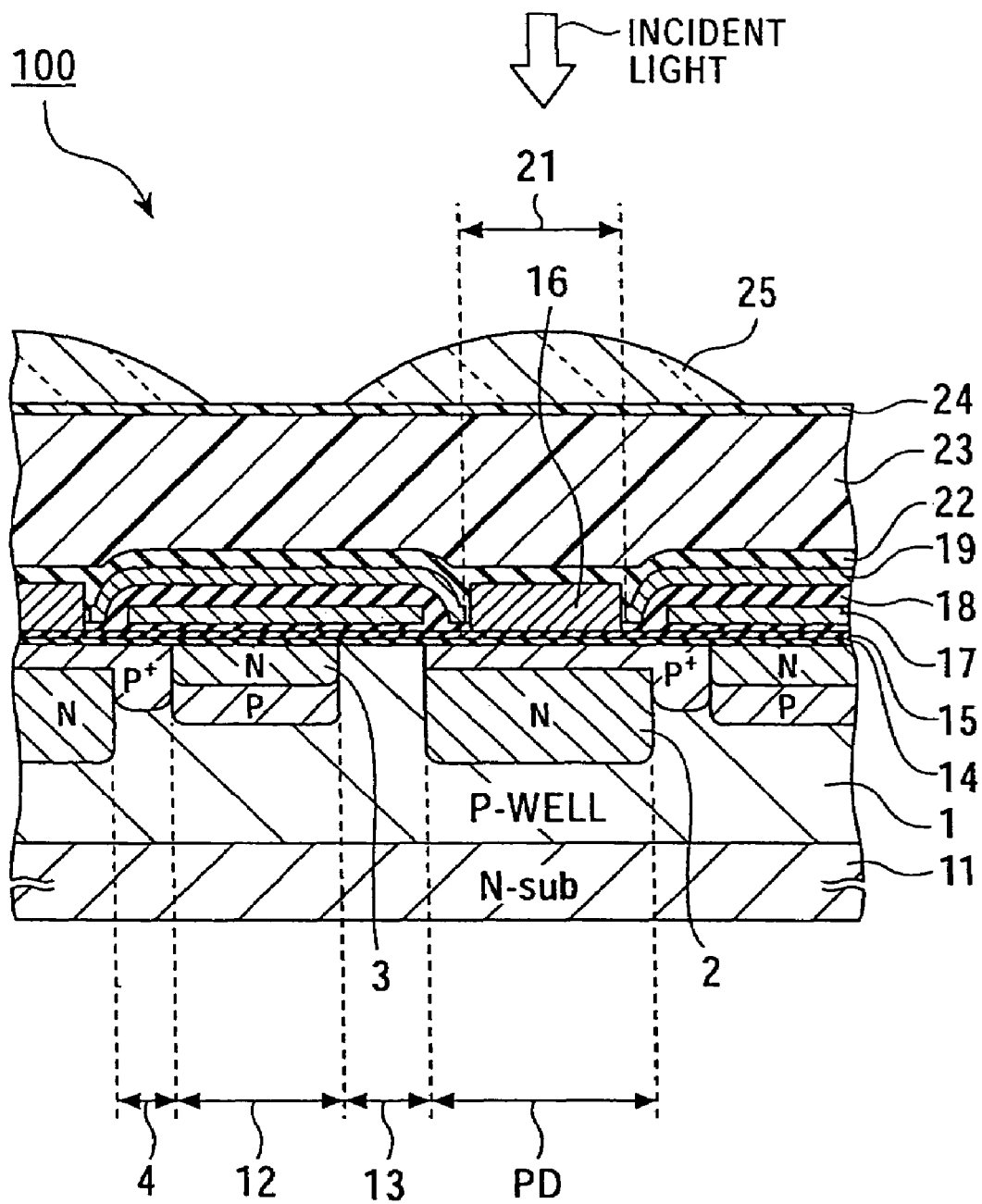
FIG. 1 is a sectional view showing an example of a structure of a photoelectric transducer according to a first embodiment of the present invention.

FIG. 1 is a sectional view showing an example of a structure of a photoelectric transducer 100 according to a first embodiment of the present invention.

In this embodiment, a refractive index matching film is provided on each of photoelectric conversion light receiving elements, and the refractive index matching film comprises an insulating compound layer represented by $SiO_xN_y$ ($0 \leq x$ and y) assuming that the molar ratio of silicon, oxygen and nitrogen of the insulating compound layer is 1:x:y. In addition, the oxygen content of the compound layer is the lowest at the interface with each light receiving element and the highest in an upper portion of the compound layer, and the nitrogen content of the compound layer is the highest at the interface with each light receiving element and the lowest in the upper portion of the compound layer.

In this embodiment, the refractive index of the compound layer serving as the refractive index matching film is continuously changed from the refractive index of a silicon oxide film of 1.45 to the refractive index of a silicon nitride film of 2.0, to minimize reflection from each light receiving element and improve light receiving sensitivity.

The photoelectric transducer 100 shown in FIG. 1 is an example of semiconductor devices for photoelectrically converting received light to output received light signals. The photoelectric transducer 100 is preferably applied to a photocoupler, a solid-state imaging device or field-effect imaging device comprising a solid-state imaging device which receives light incident from on-chip lenses provided on a color filter.

The photoelectric transducer 100 comprises a N-type silicon substrate (N-sub) 11 as an example of a semiconductor substrate. The silicon substrate 11 comprises a plurality of HAD (Hole Accumulated Diode) sensors (simply referred to as "photodiodes PD" hereinafter) as an example of photoelectric conversion light receiving elements. In this embodiment, the photodiode PD (charge coupled imaging device) of one pixel is described.

In the photoelectric transducer 100, a P-type impurity buried layer (P-WELL) 1 is provided on the N-type silicon substrate 11. The P-WELL 1 contains a photodiode PD comprising a N-type impurity region (layer) 2, and a vertical CCD (vertical transfer register) section 12 comprising a N-type impurity region (layer) 3. Furthermore, the photodiode PD is separated from the vertical CCD section 12 by a transfer gate 13 so as to read a signal charge from the photodiode PD to the vertical CCD section 12.

Furthermore, a silicon oxide film ($SiO_2$ film) serving as a gate insulating film 14 having a predetermined thickness is provided above the interface of the silicon substrate 11, and a silicon nitride film ($Si_3N_4$ film) serving as an anti-reflection film 15 is provided on the gate insulating film 14. The thickness t of each of the gate insulating film 14 and the anti-reflection film 15 is defined in the range of 10 nm $\leq$ t $\leq$ 40 nm. The thickness of each of the two films is preferably set to about 25 to 35 nm. By selecting the thickness t within this range, no adverse effect of reflection occurs, and a dark current can be prevented to prevent stress in film formation.

Furthermore, a refractive index matching film 16 having a thickness of about 1.0 μm to 2.0 μm is provided on the surface of the anti-refection film (silicon nitride film) 15 including the portion above the photodiode PD. The gate insulating film 14 and the anti-reflection film 15 are sandwiched between the photodiode PD and the refractive index matching film 16. The refractive index matching film 16 comprises an insulating compound layer represented by $SiO_xN_y$ ($0 \leq x$ and y) assuming that the molar ratio of silicon, oxygen and nitrogen of the insulating compound layer is 1:x:y. The oxygen content of the insulating compound layer is the lowest at the silicon interface with the photodiode PD and the highest in an upper portion of the compound layer, and the nitrogen content of the insulating compound layer is the highest at the silicon interface with the photodiode PD and the lowest in the upper portion of the compound layer.

The refractive index matching film 16 comprises the bottom composed of silicon nitride, and the top composed of silicon oxide. Although the insulating compound layer may comprise a plurality of insulating layers having a constant thickness, the insulating compound layer preferably comprises layers having thicknesses continuously varying to satisfy the above-described conditions of the nitrogen and oxygen contents. In this case, reflection within the layer can be minimized.

In the refractive index matching film 16, the oxygen content of the compound layer is defined in the range of $0 \leq x < 2$ so that the oxygen content is the lowest at the silicon interface with the photodiode PD and the highest in the upper portion, and the nitrogen content of the compound layer is defined in the range of $0 \leq y < 4/3$ so that the nitrogen content is the highest at the silicon interface with the photodiode PD and the lowest in the upper portion.

Namely, in the compound layer, oxygen is continuously distributed based on the oxygen content condition of $0 \leq x < 2$ so that the oxygen content is the lowest at the silicon interface with the photodiode PD and the highest in the upper portion. Also, in the compound layer, nitrogen is continuously distributed based on the nitrogen content condition of $0 \leq y < 4/3$ so that the nitrogen content is the highest at the silicon interface with the photodiode PD and the lowest in the upper portion.

The insulating compound layer is preferably deposited by a low-pressure CVD apparatus. During deposition, an oxygen gas flow rate is controlled according to a continuous increasing function (including primary and secondary functions). At the same time, a nitrogen gas flow rate is controlled according to a decreasing function (including primary and secondary functions). In this embodiment, the compound layer represented by $SiO_xN_y$ satisfies $4=2x+3y$, and x increases from the bottom to the top.

Furthermore, a transfer electrode 17 is formed on the vertical CCD section 12 through the gate insulating film (silicon oxide film) 14. The transfer electrode 17 is covered with a shielding film 19 composed of aluminum or tungsten through an interlayer insulating film 18. The shielding film 19 has an aperture formed above the photodiode PD. The aperture functions as a light receiving window 21. The shielding film 19 is coated with a cover film 22 comprising a silicon oxide film of PSG or the like.

Figure 2:
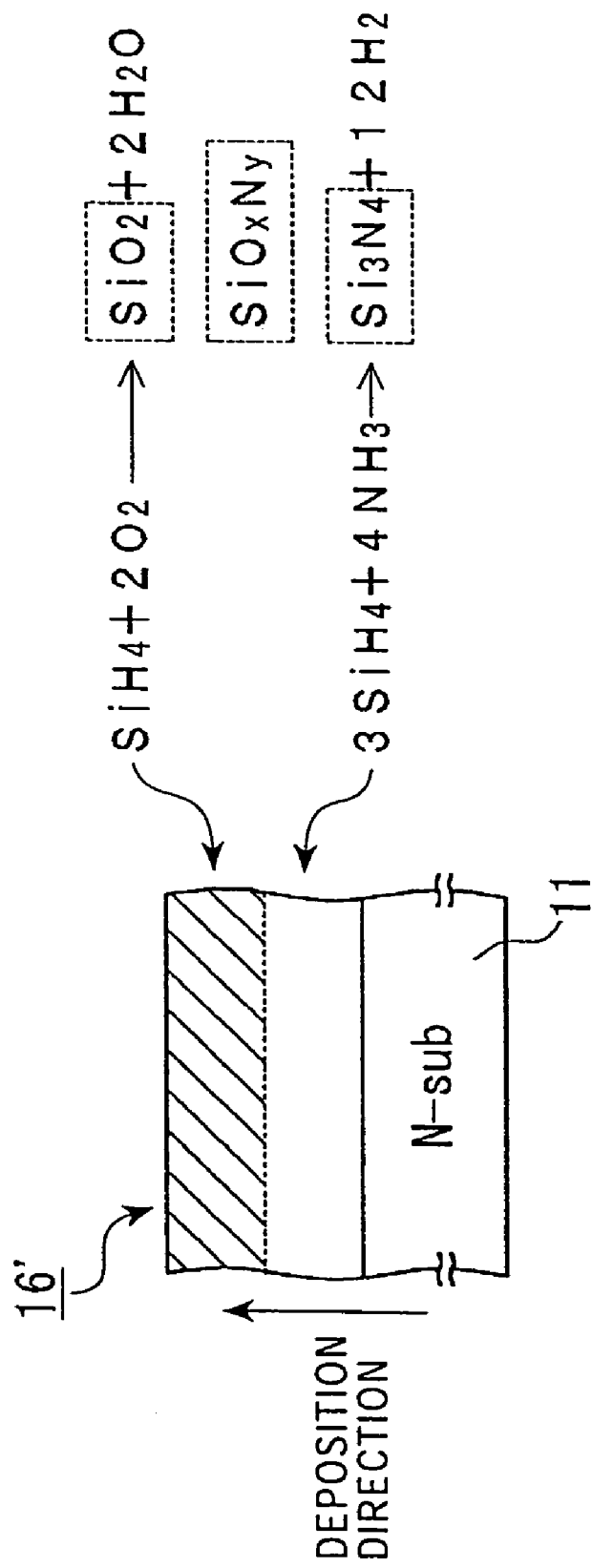
FIG. 2 is a conceptual diagram showing an example of a structure of an insulating compound layer represented by $SiO_xN_y$ ($0 \leq x$ and $y$)

FIG. 2 is a conceptual diagram showing an example of a structure of an insulating compound layer 16' represented by $SiO_xN_y$ ($0 \leq x$ and y). In FIG. 2, the refractive index matching film 16 comprises the insulating compound layer 16' represented by $SiO_xN_y$ ($0 \leq x$ and y). The refractive index matching film 16 is formed by patterning the insulating compound layer 16', and comprises the bottom composed of silicon nitride ($Si_3N_4$). The refractive index of a silicon nitride film is about 2.0, and is higher than that of a silicon oxide film.

The silicon nitride film is generally formed by $SiH_4$ gas and ammonia gas used as raw material gases according to chemical reaction represented by the following formula (1):

$$3SiH_4 + 4NH_3 \rightarrow Si_3N_4 + 12H_2 \qquad (1)$$

The top of the refractive index matching film 16 comprises silicon oxide ($SiO_2$). The refractive index of a silicon oxide film is about 1.45. The silicon oxide film is generally formed by $SiH_4$ gas and $O_2$ gas used as raw material gases according to chemical reaction represented by the following formula (2):

$$SiH_4 + 2O_2 \rightarrow SiO_2 + 2H_2O \qquad (2)$$

In the insulating compound layer 16' represented by $SiO_xN_y$ ($0 \leq x$ and y), the film quality continuously (in analog) changes between the bottom composed of silicon nitride and the top composed of silicon oxide. The refractive index of the compound layer 16' continuously changes from the refractive index of the silicon oxide film of 1.45 to the refractive index of the silicon nitride film of 2.0. This is optimum for the refractive index matching film 16.

Figure 3:
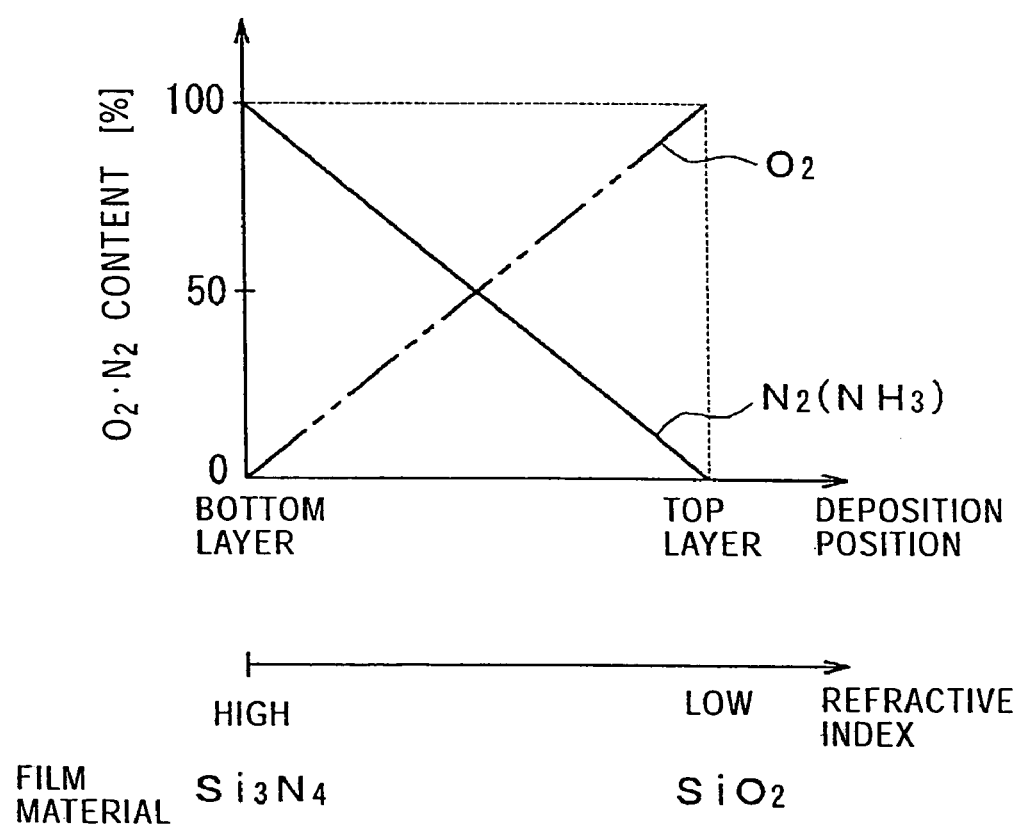
FIG. 3 is a conceptual diagram showing an example of a relationship between the oxygen and nitrogen contents of the insulating compound layer shown in FIG. 2.

FIG. 3 is a conceptual diagram showing an example of the relationship between the oxygen and nitrogen contents of the insulating compound layer 16' represented by $SiO_xN_y$ ($0 \leq x$ and y). In FIG. 3, the oxygen ($O_2$) and nitrogen ($N_2$) contents (%) are shown on the ordinate, and the deposition position in the deposition direction and refractive index of the insulating compound layer 16' are shown on the abscissa.

The insulating compound layer 16' is preferably deposited by using a low-pressure CVD apparatus. During deposition, as shown in FIG. 3, an oxygen gas flow rate is controlled according to a continuous increasing function (including primary and secondary functions). At the same time, a nitrogen gas flow rate is controlled according to a decreasing function (including primary and secondary functions). In this embodiment, the compound layer 16' represented by $SiO_xN_y$ satisfies $4=2x+3y$, and x increases from the bottom to the top.

Therefore, in the photoelectric transducer 100 of the first embodiment of the present invention, the refractive index of the compound layer 16' serving as the refractive index matching film 16 can be continuously changed from the refractive index of the silicon oxide film of 1.45 to the refractive index of the silicon nitride film of 2.0, as compared with a case in which a silicon nitride single film and a silicon oxide single film are simply laminated. Therefore, a boundary between the silicon nitride film and the silicon oxide film can be removed, thereby minimizing reflection from the photodiode PD.

Therefore, multiple reflection is decreased to improve light receiving sensitivity, as compared with the case in which the silicon nitride single film and the silicon oxide single film are simply laminated. Furthermore, diffused reflection due to multiple reflection can be suppressed to improve a smear. The refractive index matching film 16 comprising the insulating compound layer 16' causes no stress, and thus causes less dark current.

Semiconductor Manufacturing Apparatus

Figure 4:
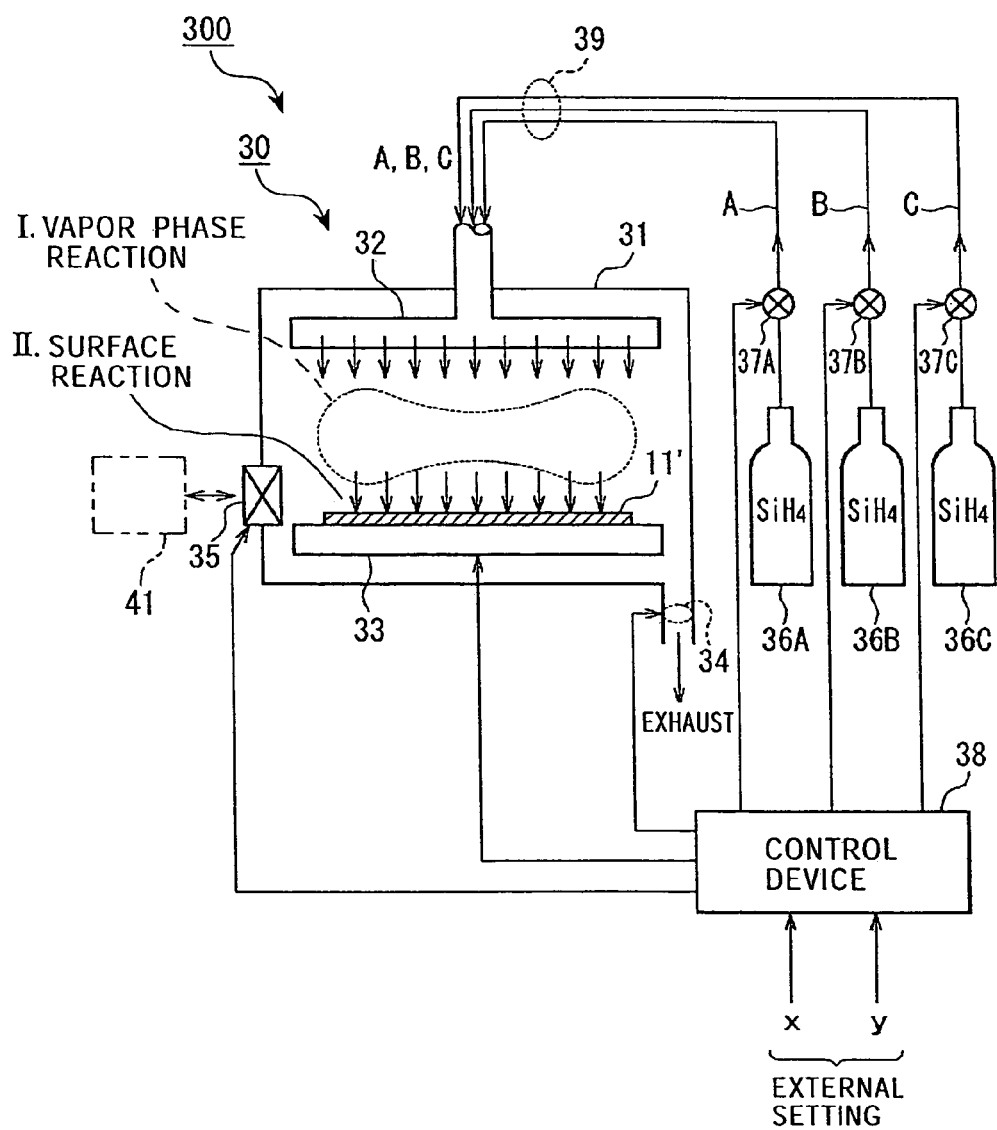
FIG. 4 is a block diagram showing an example of a configuration of a semiconductor manufacturing apparatus according to an embodiment of the present invention.

FIG. 4 is a block diagram showing an example of a configuration of a semiconductor manufacturing apparatus 300 according to an embodiment of the present invention.

The semiconductor manufacturing apparatus 300 shown in FIG. 4 is an apparatus for manufacturing the photoelectric transducer 100 shown in FIG. 1, and the like. In the semiconductor manufacturing apparatus 300, a plurality of photoelectric conversion photodiodes PD are previously formed on the silicon substrate 11 by a formation means 41 such as an ion implantation apparatus or the like. Then, the refractive index matching film 16 is deposited each the photodiode PD by a low-pressure CVD apparatus 30 as an example of deposition means.

The low-pressure CVD apparatus 30 comprises a chamber 31 in which a dispersion head 32 for discharging a raw material gas, and a susceptor 33 for mounting a wafer thereon are provided. Also, an exhaust treatment means 34, a shutter 35 for inserting and discharging the wafer, raw material gas cylinders 36A to 36C, gas regulating valves 37A to 37C, and a control device 38 are provided outside the chamber 31.

The shutter 35 is connected to the control device 38 so that the shutter 35 is controlled to be opened and closed for inserting and discharging the semiconductor wafer 11' into and from the chamber 31. The exhaust treatment means 34 is also connected to the control device 38 so that the exhaust treatment means 34 is controlled to evacuate the chamber 31 and discharge exhaust gas. The semiconductor wafer 11' is mounted on the susceptor 33, and the control device 38 is connected to the susceptor 33 so as to heat the semiconductor wafer 11' to a predetermined temperature and cool the semiconductor wafer 11'. Also, the dispersion head 32 is provided above the susceptor 33 in the chamber 31 to emit raw material gases A, B and C. As the raw material gases A, B and C, $SiH_4$, $NH_3$, $O_2$, and the like can be used.

A supply port of the dispersion head 32 is extended to the outside of the chamber 31, and connected to the raw material gas cylinders 36A to 36C through the gas regulating valves 37A to 37C, respectively. The raw material gas cylinders 36A, 36B and 36C are filled with the raw material gases A, B and C, respectively. The gas regulating valves 37A to 37C can be operated by the control device 38 by remote control. The control device 38 remote-controls the gas regulating valve 37A to regulate a flow rate of the raw material gas A, remote-controls the gas regulating valve 37B to regulate a flow rate of the raw material gas B, and remote-controls the gas regulating valve 37C to regulate a flow rate of the raw material gas C.

In forming the refractive index matching film 16 shown in FIG. 1, the control device 38 controls the deposition of the insulating compound layer 16' represented by $SiO_xN_y$ ($0 \leq x$ and y) assuming that the molar ratio of silicon, oxygen and nitrogen of the insulating compound layer 16' is 1:x:y so that the oxygen content of the insulating compound layer 16' is the lowest at the silicon interface with the photodiode PD and the highest in an upper portion of the compound layer 16', and the nitrogen content of the insulating compound layer 16' is the highest at the silicon interface with the photodiode PD and the lowest in the upper portion of the compound layer 16'.

In this embodiment, in order that the oxygen content of the compound layer 16' is the lowest at the silicon interface with the photodiode PD, and is the highest in the upper portion, the oxygen content of the compound layer 16' is previously set to $0 \leq x < 2$. Also, in order that the nitrogen content of the compound layer 16' is the highest at the silicon interface with the photodiode PD, and is the lowest in the upper portion, the nitrogen content of the compound layer 16' is previously set to $0 \leq y < 4/3$. The refractive index matching film 16 is deposited based on these settings.

Next, an example of an operation of the semiconductor manufacturing apparatus 300 will be described. In this example, a plurality of photoelectric conversion photodiodes PD are previously formed on the semiconductor wafer (silicon substrate) 11' by the formation means 41 such as the ion implantation apparatus. Then, the semiconductor wafer 11' is transferred from the formation means 41 to the low-pressure CVD apparatus 30, and the refractive index matching film 16 is formed on each of the photodiodes PD formed on the semiconductor wafer 11'.

On the assumption that the refractive index matching film 16 is deposited, the control device 38 controls the shutter 35 to open and close it, and the semiconductor wafer 11' is transferred into the chamber 31 and mounted on the susceptor 33. Then, the control device 38 controls the exhaust treatment means 34 to exhaust air from the chamber 31 to form a vacuum in the chamber 31. The temperature of the susceptor 33 is controlled by the control device 38 to, for example, heat the semiconductor wafer 11' to a predetermined temperature.

Then, the gas regulating valves 37A to 37C are remote-controlled by the control device 38 to emit the raw material gases A, B and C from the dispersion head 32 provided above the susceptor 33 in the chamber 31. The raw material gases A, B and C include $SiH_4$, $NH_3$, $O_2$, and the like.

In the chamber 31, a vapor phase reaction I of the raw material gases A, B and C takes place, and a surface reaction II takes place on the semiconductor wafer 11' according to the above-described formulas (1) and (2). The exhaust gas is discharged to the outside by the exhaust treatment means 34.

For example, when the molar ratio 1:x:y of silicon, oxygen and nitrogen, and the deposition time are set by the control device 38, the gas regulating valve 37C is controlled according to the continuous increasing function (including primary and secondary functions) shown in FIG. 3 to regulate the flow rate of oxygen gas. At the same time, the gas regulating valve 37B is controlled according to the continuous decreasing function (including primary and secondary functions) shown in FIG. 3 to regulate the flow rate of nitrogen gas ($NH_3$).

In this control operation, the oxygen content of the compound layer 16' is set to the lowest at the silicon interface with each photodiode PD, and the highest in the upper portion, and the oxygen flow rate is continuously regulated based on the oxygen content of $0 \leq x < 2$ in the compound layer 16'. Also, the nitrogen content of the compound layer 16' is set to the highest at the silicon interface with each photodiode PD, and the lowest in the upper portion, and the nitrogen flow rate is continuously regulated based on the nitrogen content of $0 \leq y < 4/3$ in the compound layer 16'.

Consequently, the insulating compound layer 16' represented by $SiO_xN_y$ ($0 \leq x$ and y) is deposited for the refractive index matching film 16 so that the oxygen content of the compound layer 16' is the lowest at the silicon interface with each photodiode PD and the highest in the upper portion of the compound layer 16', and the nitrogen content of the compound layer 16' is the highest at the silicon interface with each photodiode PD and the lowest in the upper portion of the compound layer 16'.

In this way, the semiconductor manufacturing apparatus 300 of the present invention is capable of manufacturing a semiconductor device 100 with high reproducibility, in which the refractive index of the compound layer 16' serving as the refractive index matching film 16 is continuously changed from the refractive index of a silicon oxide film of 1.45 to the refractive index of a silicon nitride film of 2.0, as compared with the case in which a silicon nitride single film and a silicon oxide single film are simply laminated to form the semiconductor device 100. Therefore, the semiconductor device 100 with high reliability can be manufactured.

Method of Manufacturing Semiconductor Device

FIGS. 5 to 8 are drawings showing steps in an example of the formation of the photoelectric transducer 100 of the first embodiment of the present invention.

Figure 5A:
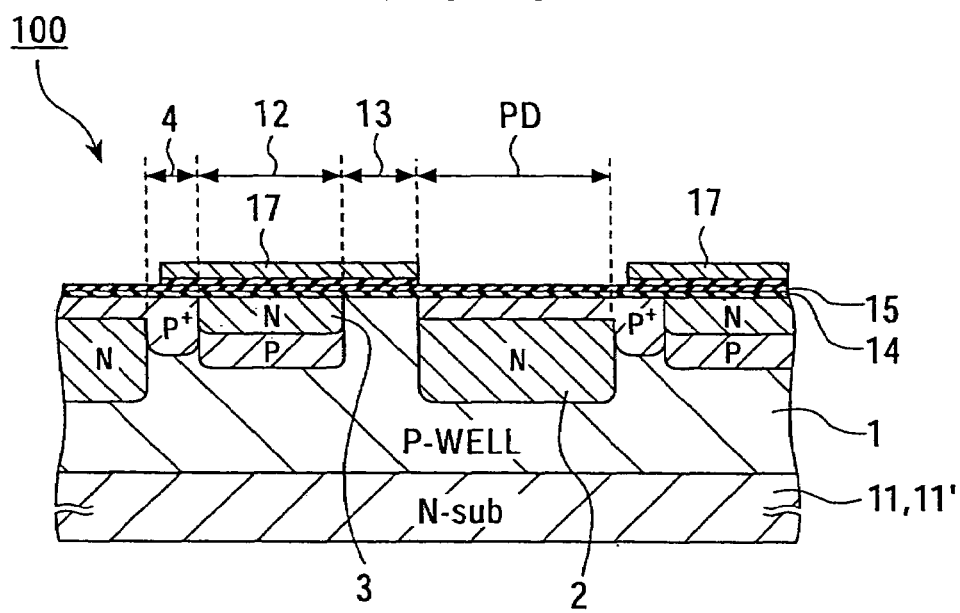
FIGS. 5A and 5B are drawings respectively showing steps in an example of formation of the photoelectric transducer of the first embodiment of the present invention.

This embodiment is based on the condition that the photoelectric transducer 100 comprising the gate insulating film 14, the anti-reflection film 15 and the refractive index matching film 16 shown in FIG. 1 is manufactured. Under this manufacturing condition, the silicon substrate 11 (semiconductor wafer 11') having the transfer electrodes 17, the photoelectric conversion photodiodes PD, the gate insulating film 14 and the anti-reflection film 15 shown in FIG. 5A is first prepared. In the semiconductor wafer 11', a predetermined impurity is implanted into the N-type silicon substrate 11 shown in FIG. 5A to form the P-type semiconductor buried layer (P-WELL) 1 in which the photodiodes PD each comprising the N-type impurity region (layer) 2 and the vertical CCD sections 12 each comprising the N-type impurity region (layer) 3 are formed.

In this structure, the transfer gate section 13 is formed as a region for reading a signal charge from each of the photodiodes PD to the corresponding vertical CCD section 12. In this example, a silicon oxide film having a predetermined thickness is formed on each of the photodiodes PD before the refractive index matching film 16 is formed on each photodiode PD. The thickness t of the silicon oxide film is defined in the range of 10 nm $\leq t \leq$ 40 nm, and preferably set to 30 nm. By setting the thickness to this value, reflection and stress can be prevented. Furthermore, polysilicon is deposited over the entire surface of the gate insulating film 14, and then selectively etched to form the transfer electrodes 17.

Figure 5B:
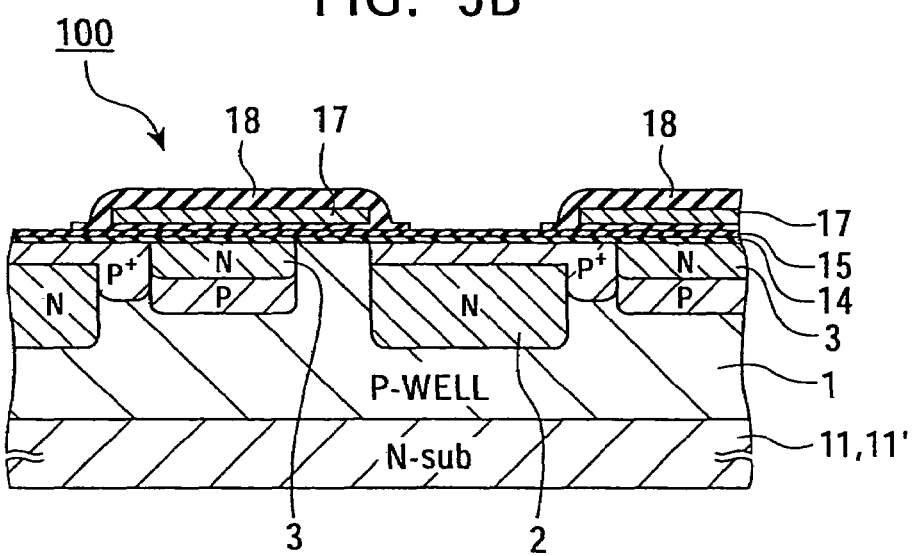
Figure 6A:
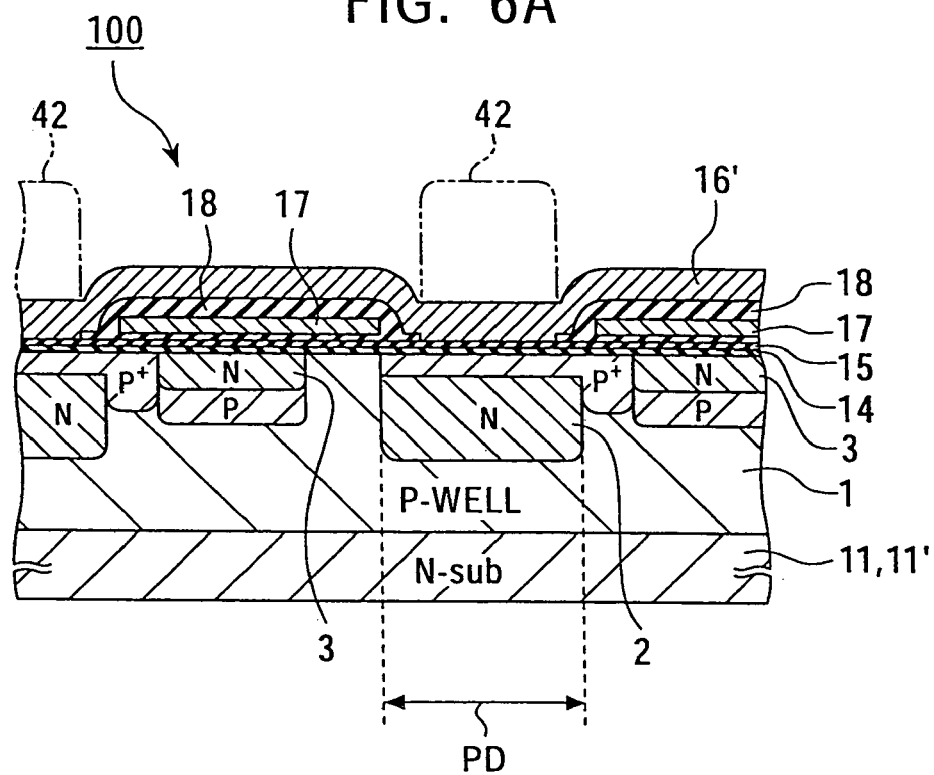
FIGS. 6A and 6B are drawings respectively showing steps performed after the step shown in FIG. 5B.

Then, as shown in FIG. 5B, the semiconductor wafer 11' is re-oxidized to form the interlayer insulating film 18 comprising a silicon oxide film. The transfer electrodes 17 can be isolated by the interlayer insulating film 18. Then, as shown in FIG. 6A, the insulating compound layer 16' is selectively formed over the entire surface of the semiconductor wafer 11' to form the refractive index matching films 16. Since the thickness of the compound layer 16' must be strictly controlled, the compound layer 16' is formed by the low-pressure CVD apparatus 30 shown in FIG. 4. Each of the refractive index matching films 16 comprises the bottom composed of silicon nitride in contact with the silicon interface with each photodiode PD, and the top composed of silicon oxide.

Therefore, each of the refractive index matching films 16 comprises the insulating compound layer 16' represented by $SiO_xN_y$ ($0 \leq x$ and $y$) assuming that the molar ratio of silicon, oxygen and nitrogen of the insulating compound layer 16' is $1:x:y$. In addition, the oxygen content of the compound layer 16' is the lowest at the silicon interface with each photodiode PD and the highest in the upper portion of the compound layer 16', and the nitrogen content of the compound layer 16' is the highest at the interface with each photodiode PD and the lowest in the upper portion of the compound layer 16'.

In forming the refractive index matching films 16, in order to set the oxygen content of the compound layer 16' to the lowest at the silicon interface with each photodiode PD and the highest in the upper portion of the compound layer 16', the oxygen content in the compound layer 16' is defined in the range of $0 \leq x < 2$. Similarly, in order to set the nitrogen content of the compound layer 16' to the highest at the interface with each photodiode PD and the lowest in the upper portion of the compound layer 16', the nitrogen content in the compound layer 16' is defined in the range of $0 \leq y < 4/3$.

In order to continuously change the oxygen and nitrogen contents of the compound layer 16', the nitrogen and oxygen flow rates in the low-pressure CVD apparatus 30 may be continuously changed during the formation of the film 16. Namely, in order to set the oxygen content of the compound layer 16' to the lowest at the silicon interface with each photodiode PD and the highest in the upper portion of the compound layer 16', the oxygen flow rate is regulated to continuously distribute based on the oxygen content of $0 \leq x < 2$ in the compound layer 16'.

In order to set the nitrogen content of the compound layer 16' to the highest at the silicon interface with each photodiode PD and the lowest in the upper portion of the compound layer 16', the nitrogen flow rate is regulated to continuously distribute based on the oxygen content of $0 \leq y < 4/3$ in the compound layer 16'. In this example, the compound layer represented by $SiO_xN_y$ satisfies $4=2x+3y$, and x increases from the bottom to the top.

Then, as shown in FIG. 6A, a resist film 42 formed on the compound layer 16' is selectively patterned as follows. First, a resist material is coated over the entire surface of the compound layer 16', and then exposed and developed by using, as a mask, a reticle having a predetermined aperture pattern formed by baking. The aperture pattern has a shape for forming the light receiving windows 21 (not shown) above the photodiodes PD. Then, the excessive resist material is removed to pattern the resist film 42.

Figure 6B:
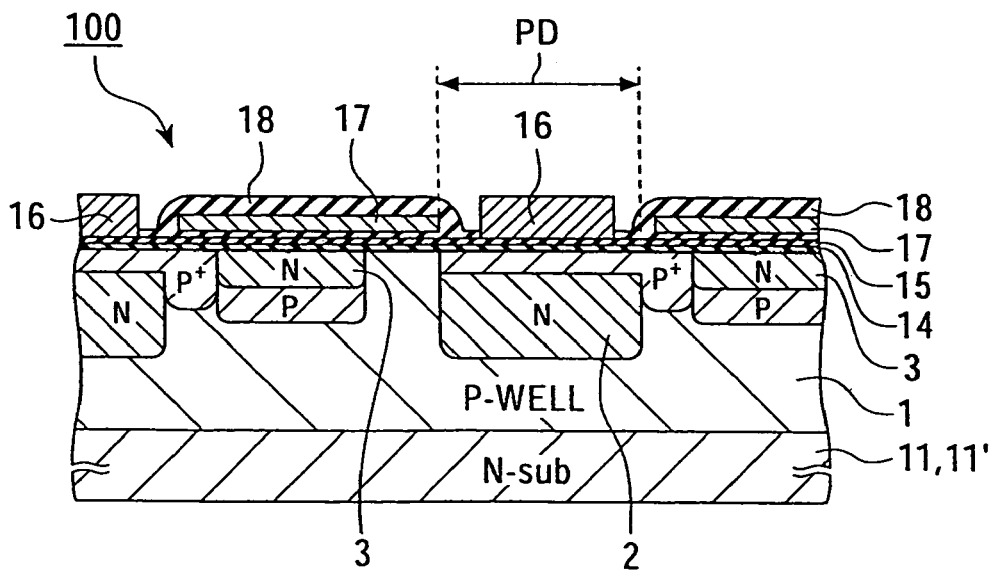

Then, the compound layer 16' is selectively etched through the resist film 42 used as the mask. The etching may be wet etching or dry etching. The wet etching is performed with an etchant comprising diluted hydrofluoric acid or phosphoric acid. As a result, as shown in FIG. 6B, the compound layer 16' (film) can be left only above each of the photodiodes PD, to form the refractive index matching films 16.

Figure 7A:
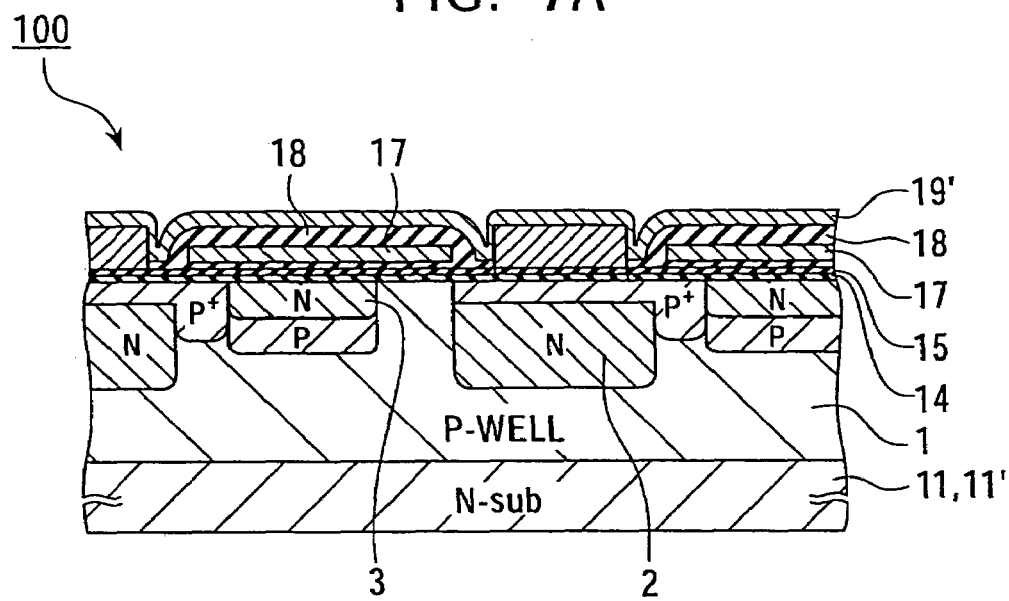
FIGS. 7A and 7B are drawings respectively showing steps performed after the step shown in FIG. 6B.
Figure 7B:
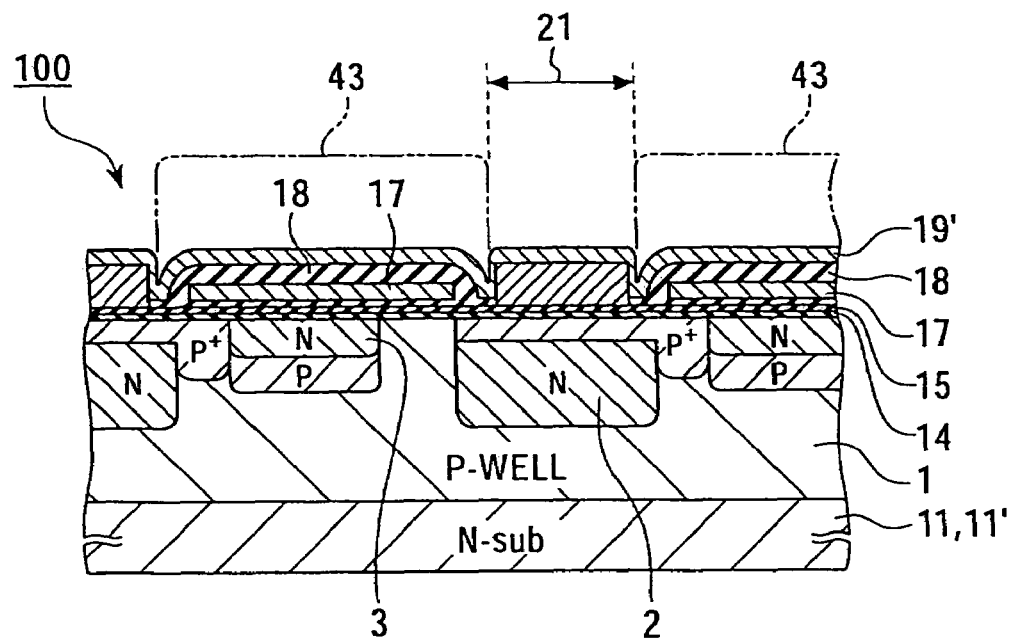

Then, as shown in FIG. 7A, aluminum or tungsten used as a material 19' for the shielding film 19 is deposited over the entire surface of the silicon substrate 11 by the same method as a conventional method. Then, as show in FIG. 7B, a resist film 43 formed on the shielding film material 19' is selectively patterned as follows.

First, a resist material is coated over the entire surface of the shielding film material 19', and then exposed and developed by using, as a mask, a reticle having a predetermined aperture pattern formed by baking. The aperture pattern has a shape for forming the light receiving windows 21 shown in FIG. 7B above the photodiodes PD. Then, the excessive resist material is removed to pattern the resist film 43.

Figure 8A:
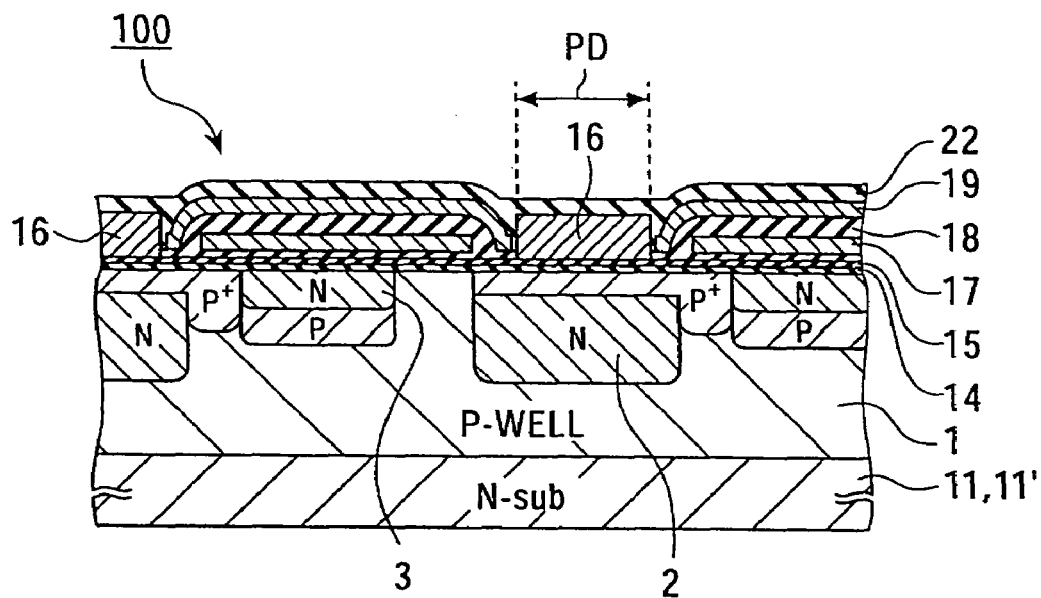
FIGS. 8A and 8B are drawings respectively showing steps performed after the step shown in FIG. 7B.

Then, the shielding film material 19' is selectively etched through the resist film 43 used as the mask. The etching is anisotropic dry etching. As a result, as shown in FIG. 8A, the peripheries of the transfer electrodes 17 can be covered without contact with the refractive index matching films 16 above the photodiodes PD. The reason for preventing contact between the shielding film material 19' and the refractive index matching films 16 is to prevent a smear. When the shielding film material 19' is overlapped with the refractive index matching film 16, a smear occurs.

Figure 8B:
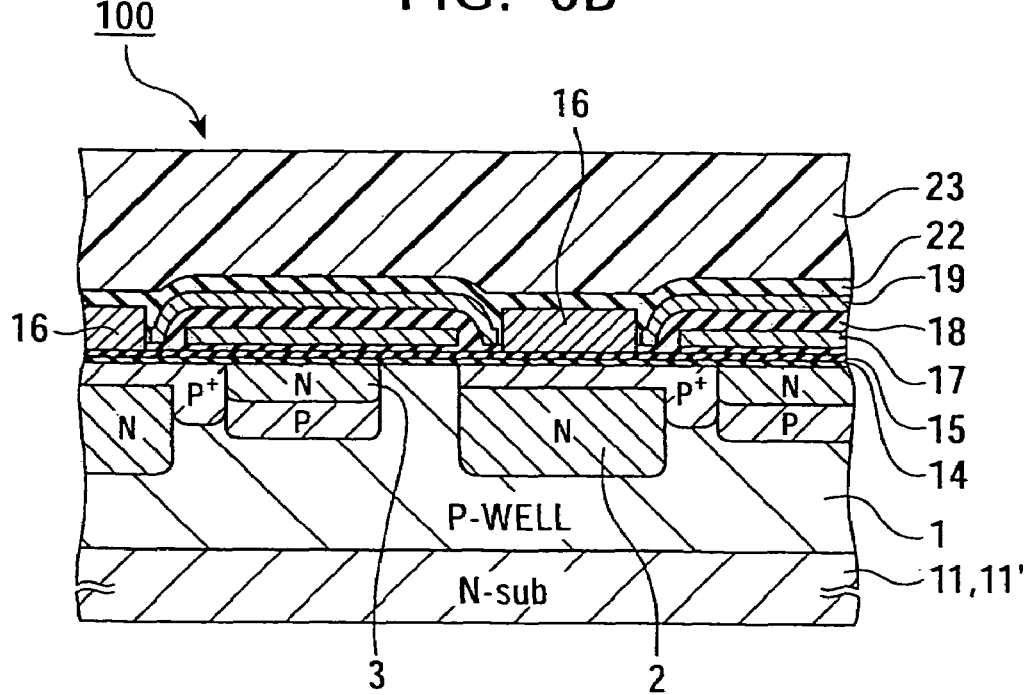

Then, the cover film 22 comprising, for example, a BPSG film is formed over the entire surface of the silicon substrate 11 on which the shielding film 19 is formed. The BPSG film is used as the cover film 22. In order to shape the BPSG film used as the cover film 22, a reflow step is performed. In this step, a heat treatment temperature is about 800° C. In the reflow step, the BPSG film is made convex in the interfacial direction to form an original shape of a lens referred to as a layer lens. Then, as shown in FIG. 8B, the planarizing film 23 is formed over the entire surface of the silicon substrate 11, and the color filter layer 24 and the microlenses 25 are formed. The forming step is finished to complete the photoelectric transducer 100 shown in FIG. 1.

The above-described method of manufacturing the photoelectric transducer 100 of the first embodiment of the present invention is capable of manufacturing the photoelectric transducer 100 with high reproducibility, in which the refractive index of the compound layer 16' serving as each refractive index matching film 16 is continuously changed from the refractive index of the silicon oxide film of 1.45 to the refractive index of the silicon nitride film of 2.0, as compared with the case in which a silicon nitride single film and a silicon oxide single film are simply laminated.

Therefore, the refractive index can be continuously changed in the order of the refractive index of the cover film 22, the refractive index of the top of the refractive index matching film 16, the refractive index of the bottom of the refractive index matching film 16, and the refractive index of the anti-reflection film 15, and the total refractive index can be changed in an analogue manner. Thus, the photoelectric transducer 100 having high reliability can be provided, as compared with a case in which films having different refractive indexes are laminated.

In this embodiment, the oxygen content of the compound layer is the lowest at the interface with each light receiving element and the highest in the upper portion of the compound layer, and the nitrogen content of the compound layer is the highest at the interface with each light receiving element and the lowest in the upper portion of the compound layer. However, the lowest oxygen content and the highest nitrogen content are not strictly at the interface with each light receiving element. Even when the oxygen and nitrogen contents are respectively the lowest and the highest near the interface with each light receiving element, the same effect as described above can be exhibited. Namely, the highest oxygen content may be set at a position above the position of the highest nitrogen content. Also, the oxygen and nitrogen contents are not necessarily continuously changed over the entire region of the compound layer, but the oxygen or nitrogen content may be constant in a region of the compound layer.

Second Embodiment

Figure 9:
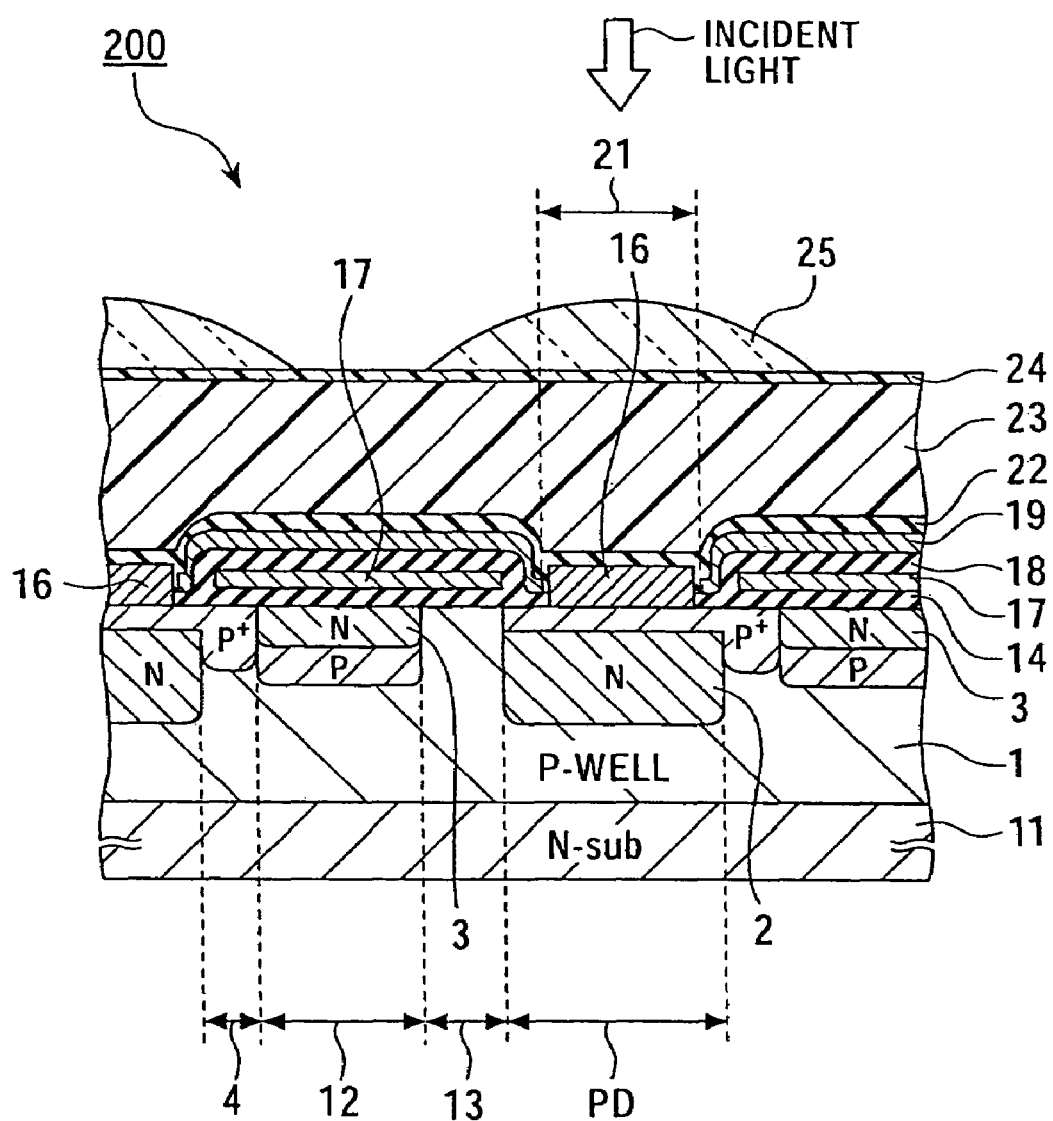
FIG. 9 is a sectional view showing an example of a structure of a photoelectric transducer according to a second embodiment of the present invention.

FIG. 9 is a sectional view showing an example of a structure of a photoelectric transducer 200 according to a second embodiment of the present invention.

The photoelectric transducer 200 shown in FIG. 9 is another example of semiconductor devices, in which a refractive index matching film 16 is formed directly on the silicon interface of each photodiode PD, and a silicon nitride single film and a gate insulating film 14 are omitted from the silicon interface so that the refractive index matching film 16 also performs the function as an anti-reflection film 15, unlike in the photoelectric transducer 100 of the first embodiment.

The photoelectric transducer 200 is preferably applied to a photocoupler, a solid-state imaging device or field-effect imaging device comprising a solid-state imaging device which receives light incident from on-chip lenses provided on a color filter. The photoelectric transducer 200 comprises, for example, a N-type silicon substrate 11. Like in the first embodiment, the silicon substrate 11 comprises a plurality of HAD (Hole Accumulated Diode) sensors (simply referred to as "photodiodes PD" hereinafter). In this embodiment, the photodiode PD (charge coupled imaging device) of one pixel is described.

In the photoelectric transducer 200, a P-type impurity buried layer (P-WELL) 1 is provided on the N-type silicon substrate 11. The P-WELL 1 contains the photodiode PD comprising a N-type impurity region (layer) 2, and a vertical CCD section 12 comprising a N-type impurity region (layer) 3. Furthermore, the photodiode PD is separated from the vertical CCD section 12 by a transfer gate 13 so as to read a signal charge from the photodiode PD to the vertical CCD section 12.

Furthermore, a silicon oxide film ($SiO_2$ film) serving as a gate insulating film 14 having a predetermined thickness is provided on the interface of the silicon substrate 11. However, unlike in the first embodiment, the single-layer gate insulating film 14 and silicon nitride film are not provided on the photodiode PD. Namely, the refractive index matching film 16 having a thickness of about 1.0 μm to 2.0 μm is provided directly on the photodiode PD. Namely, the bottom composed of silicon nitride in the refractive index matching film 16 functions as the anti-reflection film 15.

Like in the first embodiment, the refractive index matching film 16 comprises an insulating compound layer 16' represented by $SiO_xN_y$ ($0 \leq x$ and $y$) assuming that the molar ratio of silicon, oxygen and nitrogen of the insulating compound layer 16' is 1:x:y. The oxygen content of the insulating compound layer 16' is the lowest at the silicon interface with the photodiode PD and the highest in an upper portion of the compound layer 16', and the nitrogen content of the insulating compound layer is the highest at the silicon interface with the photodiode PD and the lowest in the upper portion of the compound layer 16'.

The refractive index matching film 16 comprises the bottom composed of silicon nitride, and the top composed of silicon oxide. Although the insulating compound layer 16' may comprise a plurality of insulating layers having a constant thickness, the insulating compound layer 16' preferably comprises layers having thicknesses continuously varying to satisfy the above-described conditions of the nitrogen and oxygen contents. In this case, reflection within the layer can be minimized.

In the refractive index matching film 16, the oxygen content of the compound layer 16' is defined in the range of $0 \leq x < 2$ so that the oxygen content is the lowest at the silicon interface with the photodiode PD and the highest in the upper portion, and the nitrogen content of the compound layer 16' is defined in the range of $0 \leq y < 4/3$ so that the nitrogen content is the highest at the silicon interface with the photodiode PD and the lowest in the upper portion.

Namely, in the compound layer 16', oxygen is continuously distributed based on the oxygen content condition of $0 \leq x < 2$ so that the oxygen content is the lowest at the silicon interface with the photodiode PD and the highest in the upper portion. Also, in the compound layer 16', nitrogen is continuously distributed based on the nitrogen content condition $0 \leq y < 4/3$ so that the nitrogen content is the highest at the silicon interface with the photodiode PD and the lowest in the upper portion.

Like in the first embodiment, the insulating compound layer 16' is preferably deposited by the low-pressure CVD apparatus 30. In the deposition, an oxygen gas flow rate is controlled according to a continuous increasing function (including primary and secondary functions). At the same time, a nitrogen gas flow rate is controlled according to a decreasing function (including primary and secondary functions). In this embodiment, the compound layer 16' represented by $SiO_xN_y$ satisfies $4=2x+3y$, and x increases from the bottom to the top.

Furthermore, like in the first embodiment, a transfer electrode 17 is formed on the vertical CCD section 12 through the silicon oxide film. The transfer electrode 17 is covered with a shielding film 19 composed of aluminum or tungsten through an interlayer insulating film 18. The shielding film 19 has an aperture formed above the photodiode PD. The aperture functions as a light receiving window 21. The shielding film 19 is coated with a cover film 22 comprising a silicon oxide film of PSG or the like.

In this way, in the photoelectric transducer 200 of the second embodiment of the present invention, the refractive index matching film 16 is provided directly on the silicon interface of the photodiode PD, and the refractive index of the compound layer 16' serving as the refractive index matching film 16 can be continuously changed from the refractive index of the silicon oxide film of 1.45 to the refractive index of the silicon nitride film of 2.0, as compared with a case in which a silicon nitride single film and a silicon oxide single film are simply laminated. Therefore, a boundary between the silicon nitride film and the silicon oxide film is absent, thereby minimizing reflection from the photodiode PD.

Therefore, multiple reflection is decreased to improve light receiving sensitivity, as compared with the case in which the silicon nitride single film and the silicon oxide single film are simply laminated. Furthermore, diffused reflection due to multiple reflection can be suppressed to improve a smear. The refractive index matching film 16 comprising the insulating compound layer 16' causes no stress, and thus causes less dark current.

Method of Manufacturing Semiconductor Device

FIGS. 10 to 13 are drawings showing steps (first to fourth) in an example of the formation of the photoelectric transducer 200 of the second embodiment of the present invention.

This embodiment is based on the condition that the photoelectric transducer 200 shown in FIG. 9 is manufactured. Under this manufacturing condition, the silicon substrate 11 (semiconductor wafer 11') having the transfer electrode 17 and the photoelectric conversion photodiode PD shown in FIG. 10A is first prepared.

Figure 10A:
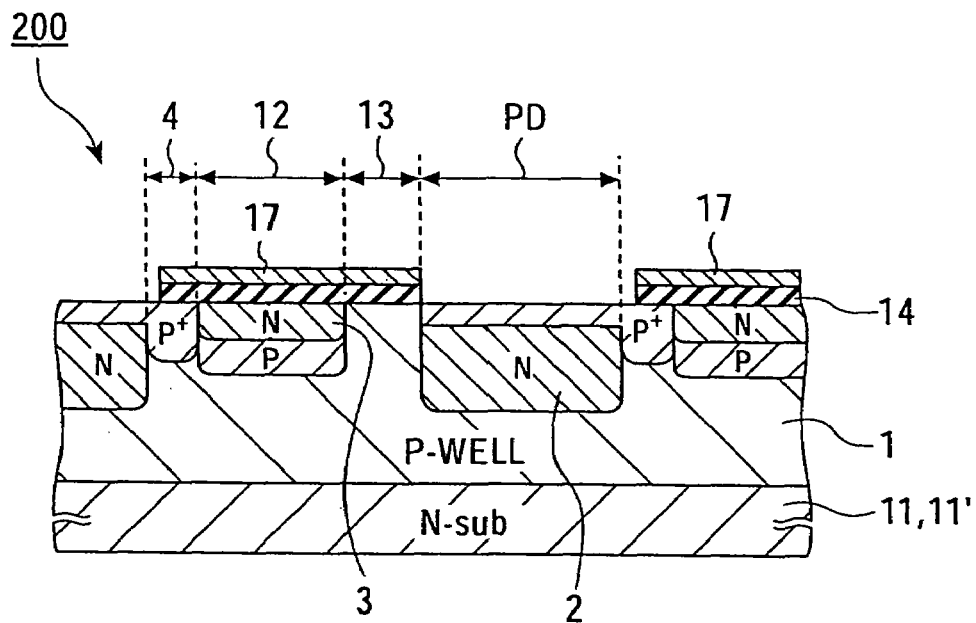
FIGS. 10A and 10B are drawings respectively showing steps in an example of formation of the photoelectric transducer of the second embodiment of the present invention.

Referring to FIG. 10A, the gate insulating film 14 and the anti-reflection film 15 are not provided on the photodiodes PD. In the semiconductor wafer 11', a predetermined impurity is implanted into the N-type silicon substrate 11 shown in FIG. 10A to form the P-type semiconductor buried layer (P-WELL) 1 in which the photodiode PD comprising the N-type impurity region (layer) 2 and the vertical CCD section 12 comprising the N-type impurity region (layer) 3 are formed.

In this structure, the transfer gate section 13 is formed as a region for reading a signal charge from the photodiode PD to the vertical CCD section 12. Furthermore, polysilicon is deposited over the entire surface of the gate insulating film 14, and then selectively etched to form the transfer electrode 17.

Figure 10B:
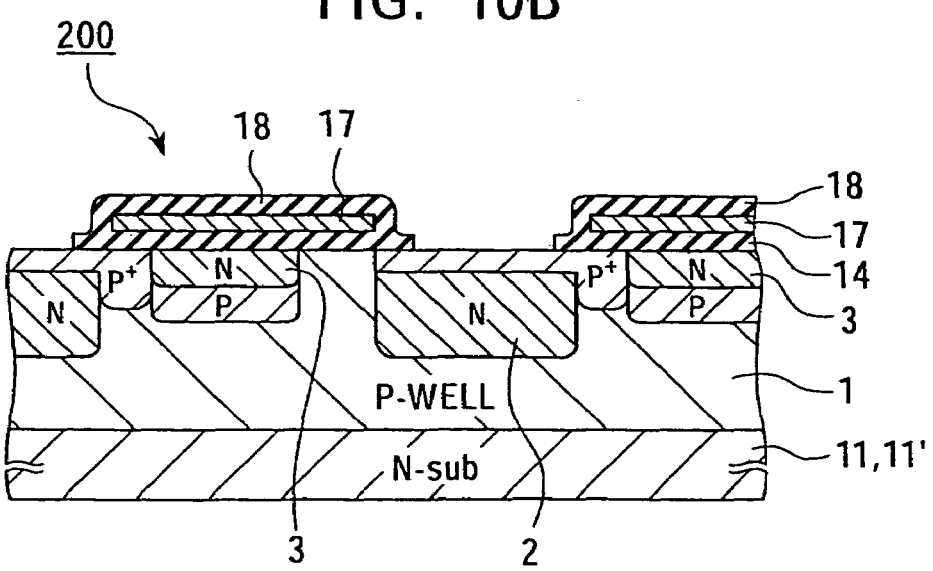

Then, as shown in FIG. 10B, the semiconductor wafer 11' is re-oxidized to form the interlayer insulating film 18 comprising a silicon oxide film. In this step, the oxide film is completely removed from the silicon interface of the photodiode PD by a plurality of times of dry or wet etching. The transfer electrode 17 can be isolated by the interlayer insulating film 18.

Figure 11A:
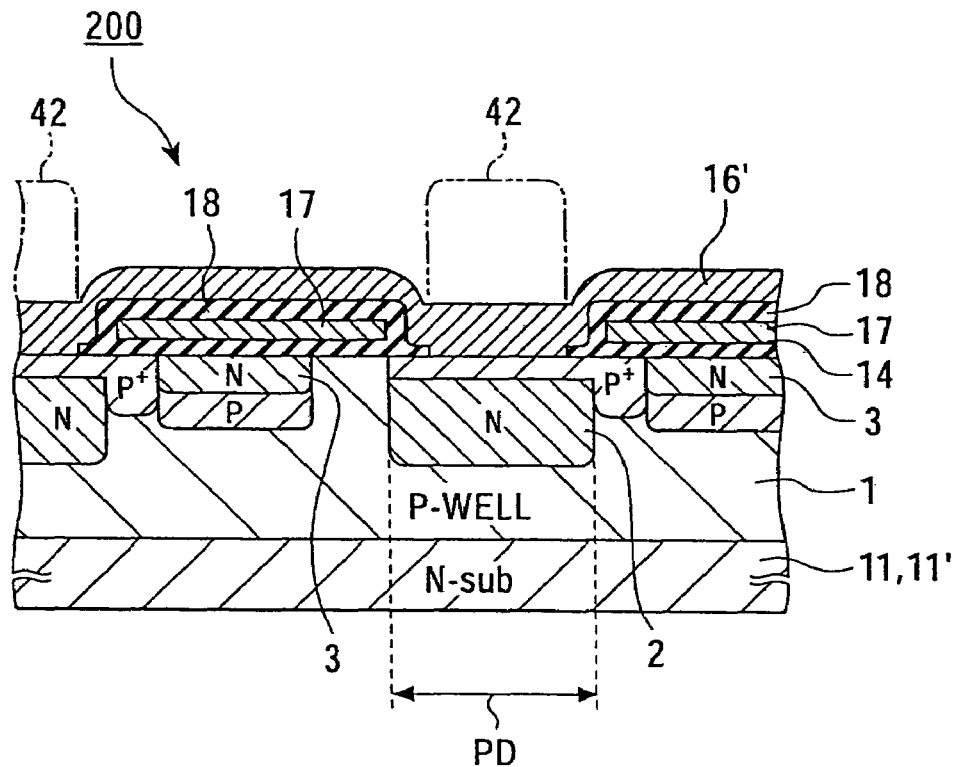
FIGS. 11A and 11B are drawings respectively showing steps performed after the step shown in FIG. 10B.

Then, as shown in FIG. 11A, the insulating compound layer 16' is selectively formed over the entire surface of the semiconductor wafer 11' to form the refractive index matching film 16. Since the thickness of the compound layer 16' must be strictly controlled, the compound layer 16' is formed by the low-pressure CVD apparatus 30 shown in FIG. 4. The refractive index matching film 16 comprises the bottom composed of silicon nitride in contact with the silicon interface of the photodiode PD, and the top composed of silicon oxide.

Therefore, the refractive index matching film 16 comprises the insulating compound layer 16' represented by $SiO_xN_y$ ($0 \leq x$ and $y$) assuming that the molar ratio of silicon, oxygen and nitrogen of the insulating compound layer 16' is 1:x:y. In addition, the oxygen content of the compound layer 16' is the lowest at the silicon interface with the photodiode PD and the highest in the upper portion of the compound layer 16', and the nitrogen content of the compound layer 16' is the highest at the interface with the photodiode PD and the lowest in the upper portion of the compound layer 16'.

In forming the refractive index matching film 16, in order to set the oxygen content of the compound layer 16' to the lowest at the silicon interface with the photodiode PD and the highest in the upper portion of the compound layer 16', the oxygen content in the compound layer 16' is defined in the range of $0 \leq x < 2$. similarly, in order to set the nitrogen content of the compound layer 16' to the highest at the interface with the photodiode PD and the lowest in the upper portion of the compound layer 16', the nitrogen content in the compound layer 16' is defined in the range of $0 \leq y < 4/3$.

In order to continuously change the oxygen and nitrogen contents of the compound layer 16', the nitrogen and oxygen flow rates in the low-pressure CVD apparatus 30 may be continuously changed during the formation of the film 16. Namely, in order to set the oxygen content of the compound layer 16' to the lowest at the silicon interface with the photodiode PD and the highest in the upper portion of the compound layer 16', the oxygen flow rate is regulated to continuously distribute based on the oxygen content of $0 \leq x < 2$ in the compound layer 16'.

In order to set the nitrogen content of the compound layer 16' to the highest at the silicon interface with the photodiode PD and the lowest in the upper portion of the compound layer 16', the nitrogen flow rate is regulated to continuously distribute based on the oxygen content of $0 \leq y < 4/3$ in the compound layer 16'. In this example, the compound layer represented by $SiO_xN_y$, satisfies $4=2x+3y$, and x increases from the bottom to the top.

Then, as shown in FIG. 11A, a resist film 42 formed on the compound layer 16' is selectively patterned as follows. First, a resist material is coated over the entire surface of the compound layer 16', and then exposed and developed by using, as a mask, a reticle having a predetermined aperture pattern formed by baking. The aperture pattern has a shape for forming the light receiving windows 21 above the photodiodes PD. Then, the excess resist material is removed to pattern the resist film 42.

Figure 11B:
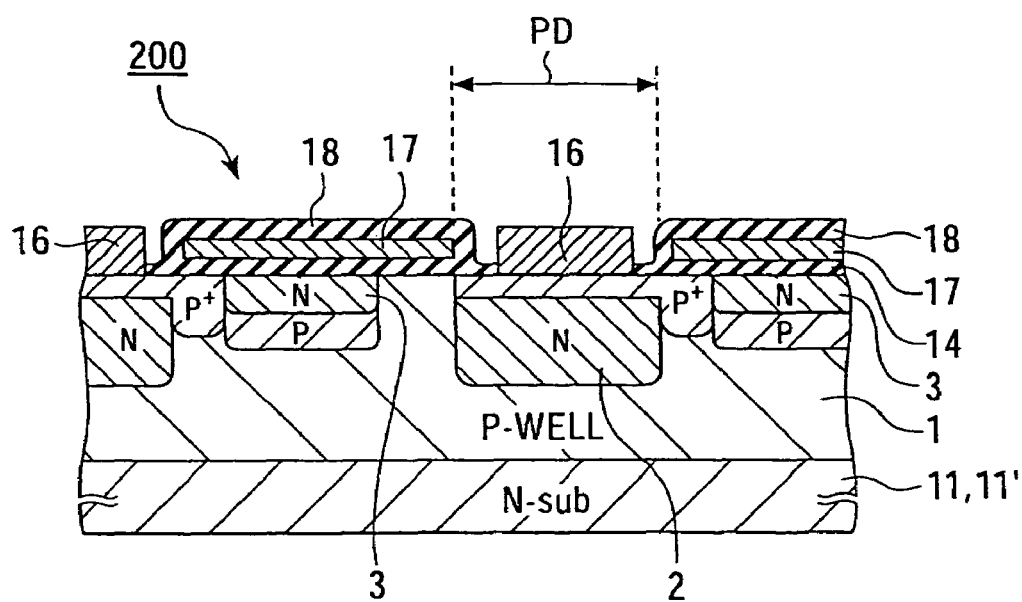

Then, the compound layer 16' is selectively etched through the resist film 42 used as the mask. The etching may be wet etching or dry etching. The wet etching is performed with an etchant comprising diluted hydrofluoric acid or phosphoric acid. As a result, as shown in FIG. 11B, the compound layer 16' (film) can be left only above the photodiode PD, to form the refractive index matching film 16.

Figure 12A:
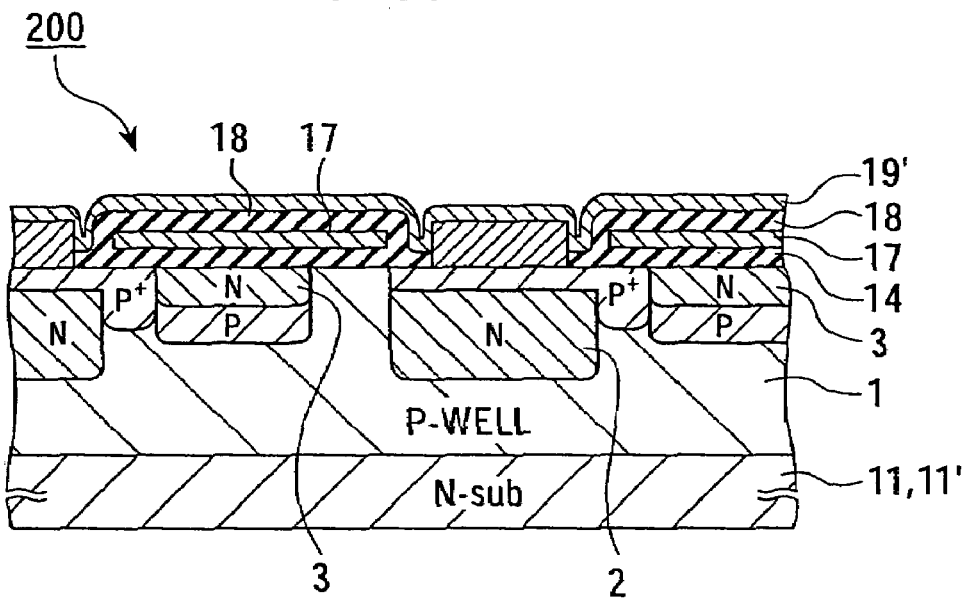
FIGS. 12A and 12B are drawings respectively showing steps performed after the step shown in FIG. 11B.
Figure 12B:
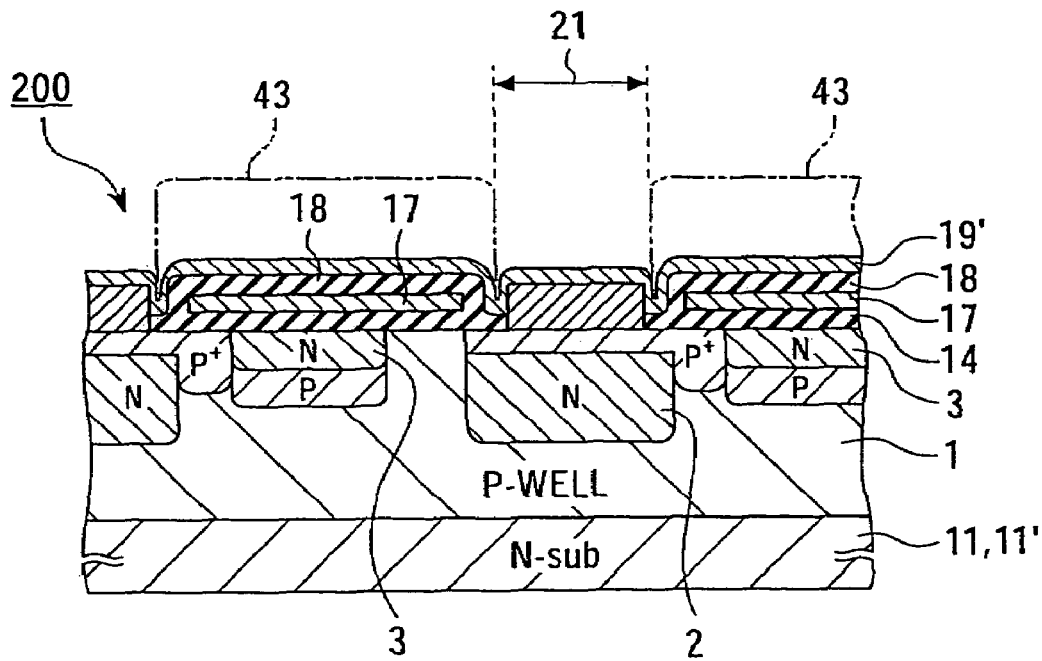

Then, as shown in FIG. 12A, aluminum or tungsten used as a material 19' for the shielding film 19 is deposited over the entire surface of the silicon substrate 11 by the same method as a conventional method. Then, as show in FIG. 12B, a resist film 43 formed on the shielding film material 19' is selectively patterned as follows.

First, a resist material is coated over the entire surface of the shielding film material 19', and then exposed and developed by using, as a mask, a reticle having a predetermined aperture pattern formed by baking. The aperture pattern has a shape slightly larger than a shape for forming the light receiving windows 21 above the photodiodes PD. Then, the excess resist material is removed to pattern the resist film 43.

Figure 13A:
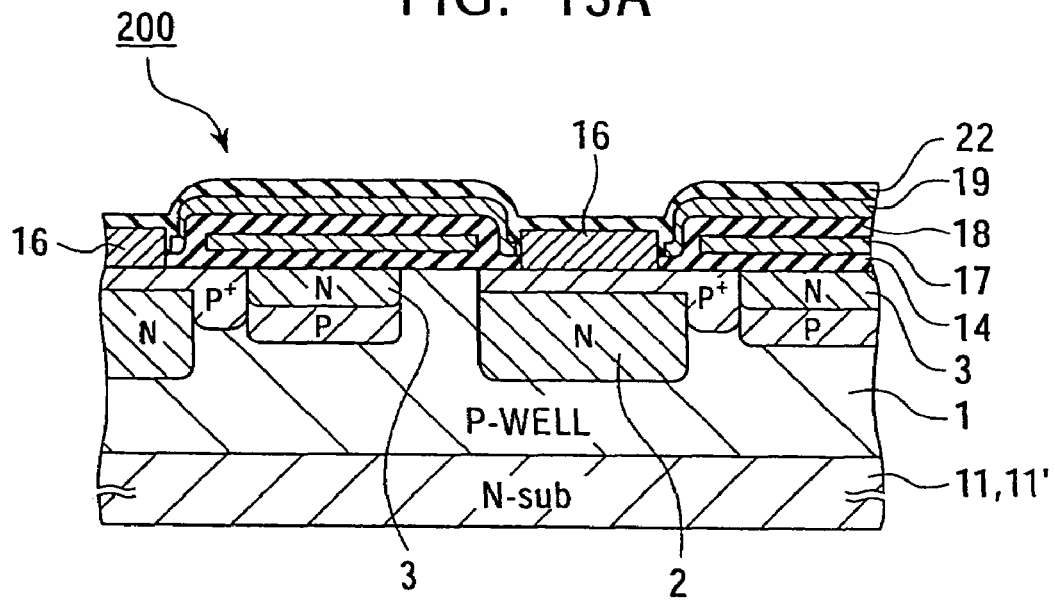
FIGS. 13A and 13B are drawings respectively showing steps performed after the step shown in FIG. 12B.

Then, the shielding film material 19' is selectively etched through the resist film 43 used as the mask. The etching is anisotropic dry etching. As a result, as shown in FIG. 13A, the peripheries of the transfer electrodes 17 can be covered without contact with the refractive index matching films 16 above the photodiodes PD. The reason for preventing contact between the shielding film material 19' and the refractive index matching film 16 is to prevent a smear. When the shielding film material 19' is overlapped with the refractive index matching film 16, a smear occurs.

Figure 13B:
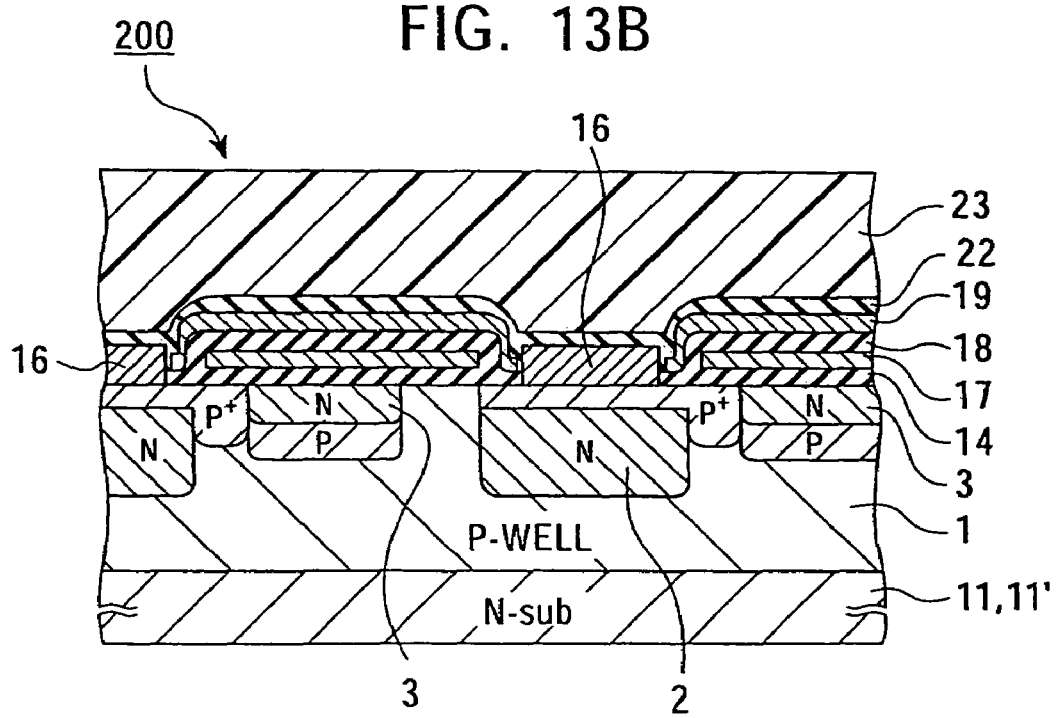
Figure 14:
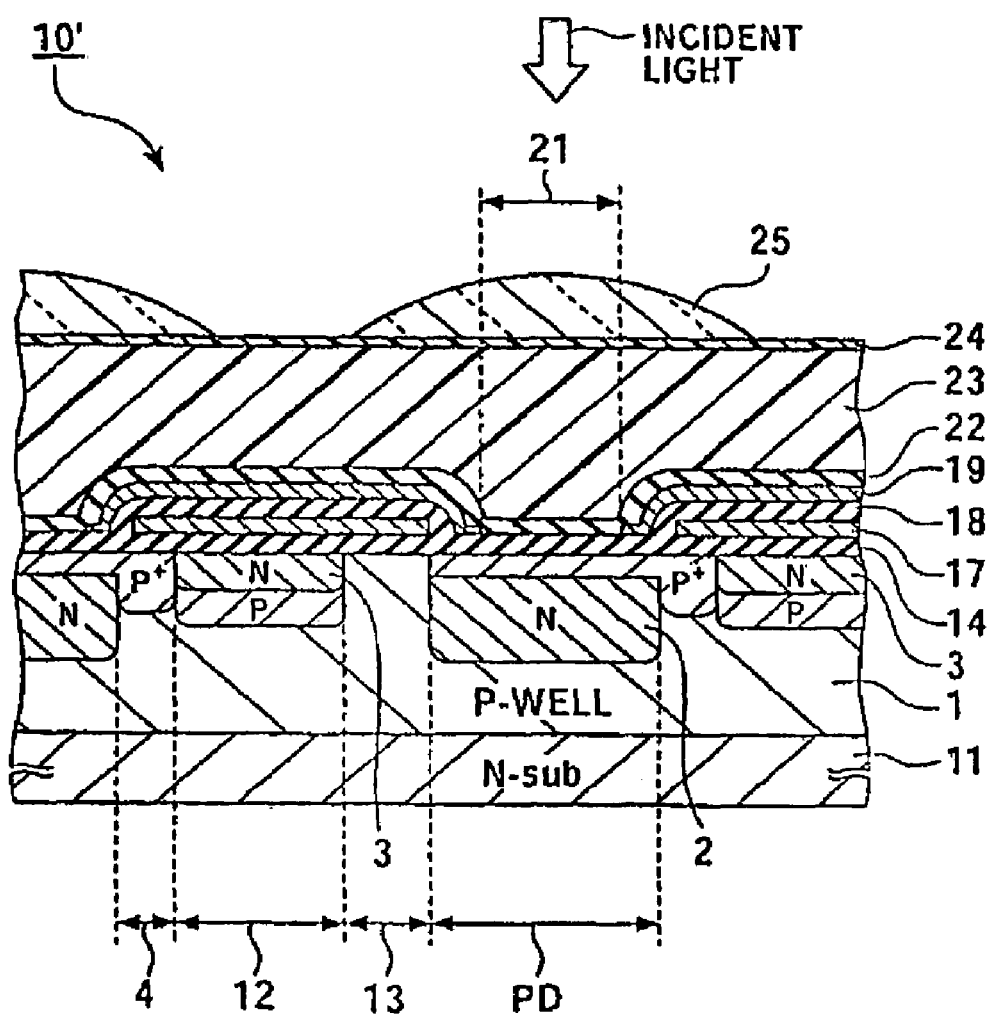
FIG. 14 is a sectional view showing a structure of a solid-state imaging device of a first conventional example.
Figure 15:
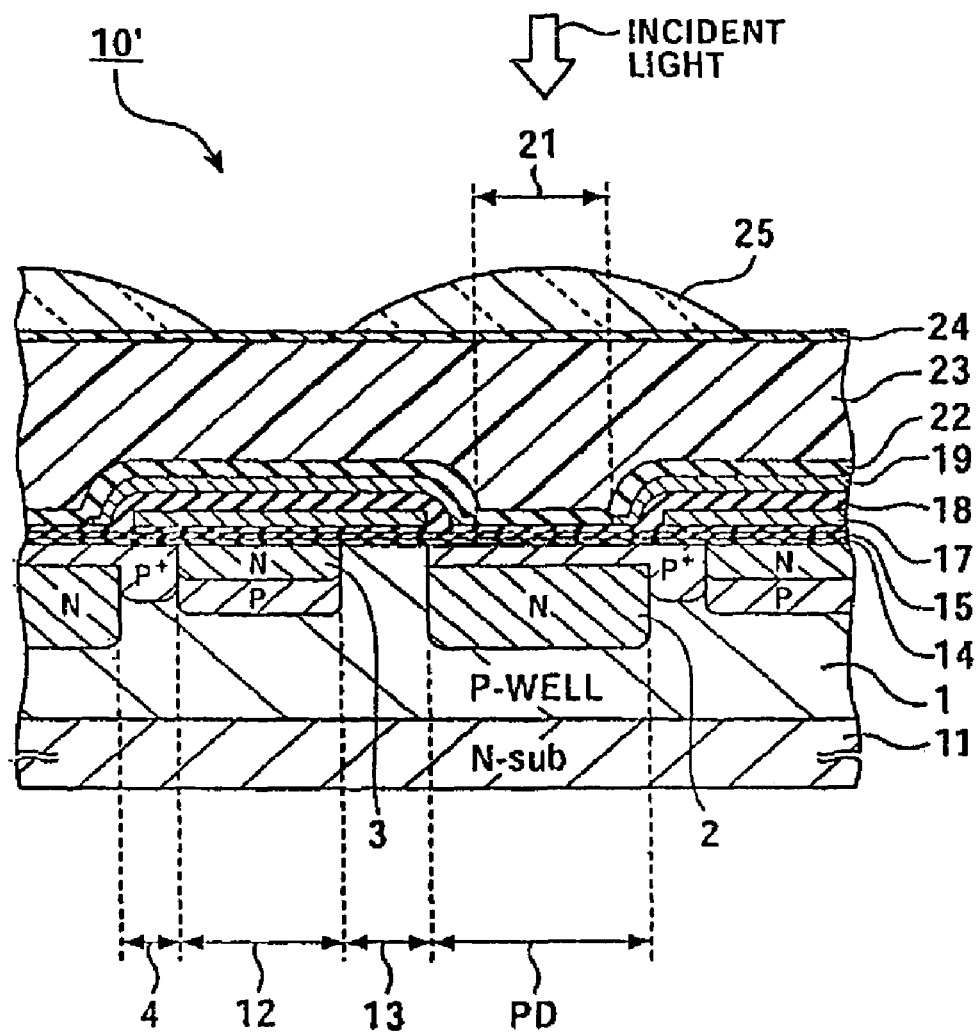
FIG. 15 is a sectional view showing a structure of a solid-state imaging device of a second conventional example.

Then, the cover film 22 comprising, for example, a BPSG film, is formed over the entire surface of the silicon substrate 11 on which the shielding film 19 is formed. In order to shape the BPSG film, a reflow step is performed. In this step, a heat treatment temperature is about 800° C. In the reflow step, the BPSG film is made convex in the interfacial direction to form an original shape of a lens referred to as a layer lens. Then, as shown in FIG. 13B, the planarizing film 23 is formed over the entire surface of the silicon substrate 11, the color filter 24, and the microlenses 25 are formed. The forming step is finished to complete the photoelectric transducer 200 shown in FIG. 9.

The above-described method of manufacturing the photoelectric transducer 200 of the second embodiment of the present invention is capable of manufacturing the photoelectric transducer 200 with high reproducibility, in which the refractive index matching film is deposited directly on the silicon interface of the photodiode PD, and thus the refractive index of the compound layer 16' serving as the refractive index matching film 16 is continuously changed from the refractive index of the silicon oxide film of 1.45 to the refractive index of the silicon nitride film of 2.0, as compared with the case in which a silicon nitride single film and a silicon oxide single film are simply laminated.

Therefore, the refractive index can be continuously changed in the order of the refractive index of the cover film 22, the refractive index of the top of the refractive index matching film 16, the refractive index of the bottom of the refractive index matching film 16, and the refractive index of the anti-reflection film 15, and the total refractive index can be changed in an analogue manner. Thus, the photoelectric transducer 200 having high reliability can be provided, as compared with the case in which films having different refractive indexes are laminated.

In this embodiment, the oxygen content of the compound layer is the lowest at the interface with each light receiving element and the highest in the upper portion of the compound layer, and the nitrogen content of the compound layer is the highest at the interface with each light receiving element and the lowest in the upper portion of the compound layer. However, the lowest oxygen content and the highest nitrogen content are not strictly at the interface with each light receiving element. Even when the oxygen and nitrogen contents are respectively the lowest and the highest near the interface with each light receiving element, the same effect as described above can be exhibited. Namely, the highest oxygen content may be set at a position above the position of the highest nitrogen content. Also, the oxygen and nitrogen contents are not necessarily continuously changed over the entire region of the compound layer, but the oxygen or nitrogen content may be constant in a region of the compound layer.

As described above, in a semiconductor device of the first embodiment of the present invention, an insulating compound layer is provided on a semiconductor substrate, and the insulating compound layer is represented by $SiO_xN_y$ ($0 \leq x$ and y) assuming that the molar ratio of silicon, oxygen and nitrogen of the insulating compound layer is 1:x:y. The oxygen content of the insulating compound layer is the lowest at the interface with the semiconductor substrate and the highest in an upper portion of the compound layer, and the nitrogen content of the insulating compound layer is the highest at the interface with the semiconductor substrate and the lowest in the upper portion of the compound layer.

In this structure, the refractive index of the compound layer serving as a refractive index matching film can be continuously changed from the refractive index of a silicon oxide film of 1.45 to the refractive index of a silicon nitride film of 2.0, as compared with a case in which a silicon nitride single film and a silicon oxide single film are simply laminated. Therefore, a boundary between the silicon nitride film and the silicon oxide film can be removed, thereby minimizing reflection on the light receiving element.

In the semiconductor device of the second embodiment of the present invention, the insulating compound layer of the semiconductor device of the first embodiment is used as a refractive index matching film. Namely, the refractive index matching film is provided on the photoelectric conversion light receiving element, and the refractive index matching film comprises the insulating compound layer represented by $SiO_xN_y$ ($0 \leq x$ and y) assuming that the molar ratio of silicon, oxygen and nitrogen of the insulating compound layer is 1:x:y. The oxygen content of the insulating compound layer is the lowest at the interface with the light receiving element and the highest in au upper portion of the compound layer, and the nitrogen content of the insulating compound layer is the highest at the interface with the light receiving element and the lowest in the upper portion of the compound layer.

In this structure, the refractive index of the compound layer serving as the refractive index matching film can be continuously changed from the refractive index of a silicon oxide film of 1.45 to the refractive index of a silicon nitride film of 2.0, as compared with a case in which a silicon nitride single film and a silicon oxide single film are simply laminated. Therefore, a boundary between the silicon nitride film and the silicon oxide film can be removed, thereby minimizing reflection from the light receiving element. Therefore, multiple reflection is decreased to improve light receiving sensitivity, as compared with the case in which the silicon nitride single film and the silicon oxide single film are simply laminated. Furthermore, diffused reflection due to multiple reflection can be suppressed to improve a smear.

In the method of manufacturing the semiconductor device of the present invention, a plurality of photoelectric conversion light receiving elements are formed on the semiconductor substrate, and then the refractive index matching film is formed on the light receiving elements on the semiconductor substrate. The refractive index matching film comprises the insulating compound layer represented by $SiO_xN_y$ ($0 \leq x$ and y) assuming that the molar ratio of silicon, oxygen and nitrogen of the insulating compound layer is 1:x:y. The oxygen content of the insulating compound layer is the lowest at the interface with each light receiving element and the highest in au upper portion of the compound layer, and the nitrogen content of the insulating compound layer is the highest at the interface with each light receiving element and the lowest in the upper portion of the compound layer.

This method is capable of manufacturing the semiconductor device with high reproducibility in which the refractive index of the compound layer serving as the refractive index matching film can be continuously changed from the refractive index of a silicon oxide film of 1.45 to the refractive index of a silicon nitride film of 2.0, as compared with a case in which a silicon nitride single film and a silicon oxide single film are simply laminated. Therefore, the semiconductor device with high reliability can be provided.

The apparatus for manufacturing the semiconductor device of the present invention comprises deposition means for depositing the refractive index matching film on the light receiving elements formed on the semiconductor substrate. The refractive index matching film deposited by the deposition means comprises the insulating compound layer represented by $SiO_xN_y$ ($0 \leq x$ and y) assuming that the molar ratio of silicon, oxygen and nitrogen of the insulating compound layer is 1:x:y. The oxygen content of the insulating compound layer is the lowest at the interface with each light receiving element and the highest in au upper portion of the compound layer, and the nitrogen content of the insulating compound layer is the highest at the interface with each light receiving element and the lowest in the upper portion of the compound layer.

This apparatus is capable of manufacturing the semiconductor device with high reproducibility in which the refractive index of the compound layer serving as the refractive index matching film can be continuously changed from the refractive index of a silicon oxide film of 1.45 to the refractive index of a silicon nitride film of 2.0, as compared with a case in which a silicon nitride single film and a silicon oxide single film are simply laminated. Therefore, the semiconductor device with high reliability can be provided.

The present invention is preferably applied to a photoelectric conversion device such as a photocoupler or the like, a solid state imaging device or field effect imaging device comprising a semiconductor imaging device for receiving light incident from an on-chip lens provided on a color filter.

What is claimed is:

1. A method of manufacturing a semiconductor device for photoelectrically converting received light to output a received light signal, the method comprising:

providing a plurality of photoelectric conversion light receiving elements formed of a semiconductor material; and forming a refractive index matching film over each of the light receiving elements, wherein the refractive index matching film has an oxygen content that is lowest in a portion closest to each light receiving element and highest in an upper portion of the refractive index matching film.

2. A method of manufacturing a semiconductor device for photoelectrically converting received light to output a received light signal, the method comprising:

providing a plurality of photoelectric conversion light receiving elements formed of a semiconductor material; and forming a refractive index matching film over each of the light receiving elements, wherein the refractive index matching film comprises an insulating compound layer represented by $SiO_xN_y$ ($0 \leq x$ and $y$) assuming that the molar ratio of silicon, oxygen and nitrogen of the insulating compound layer is $1:x:y$, the oxygen content of the compound layer is lowest in a portion closest to each light receiving element and highest in an upper portion of the refractive index matching film, and the nitrogen content of the compound layer is highest in a portion closest to each light receiving element and lowest in an upper portion of the refractive index matching film.

3. A method of manufacturing a semiconductor device according to claim 2, wherein in forming the refractive index matching film, the oxygen content is in the range of $0 \leq x < 2$, and the nitrogen content is in the range of $0 \leq y < 4/3$.

4. A method of manufacturing a semiconductor device according to claim 2, wherein the oxygen content is distributed in the refractive index matching film while satisfying the relationship the range of $0 \leq x < 2$; and the nitrogen content is distributed in the refractive index matching film while satisfying the relationship $0 \leq y < 4/3$.

5. A method of manufacturing a semiconductor device according to claim 2, wherein the refractive index material film represented by $SiOxNy$ satisfies the relationship $4 = 2x + 3y$, and x increases from the bottom to the top.

6. A method of manufacturing a semiconductor device according to claim 2, wherein the refractive index matching film comprises silicon nitride closest to the light receiving elements, and silicon oxide farthest from the light receiving elements.

7. A method of manufacturing a semiconductor device according to claim 2, further comprising forming a silicon oxide film having a predetermined thickness above the light receiving elements before forming the refractive index matching films.

8. A method of manufacturing a semiconductor device according to claim 7, wherein a thickness t of the silicon oxide film is in the range of 10 nm $\leq t \leq$ 40 nm.

* * * * *